United States Patent [19]
Kerstein

[11] Patent Number: 6,111,874
[45] Date of Patent: Aug. 29, 2000

[54] SHARED ADDRESS TABLE WITH SOURCE AND DESTINATION TWO-PASS ALGORITHM

[75] Inventor: Denise Kerstein, Palo Alto, Calif.

[73] Assignee: Advanced Micro Devices, Inc., Sunnyvale, Calif.

[21] Appl. No.: 08/993,048

[22] Filed: Dec. 18, 1997

Related U.S. Application Data

[60] Provisional application No. 60/038,025, Feb. 14, 1997.

[51] Int. Cl.[7] .............................. H04L 12/28; H04L 12/56
[52] U.S. Cl. ........................................... 370/389; 370/392
[58] Field of Search ................................... 370/389, 390, 370/392, 400–2, 409, 428–9

[56] References Cited

U.S. PATENT DOCUMENTS

| | | | |
|---|---|---|---|
| 5,305,321 | 4/1994 | Crayford . | |
| 5,394,402 | 2/1995 | Ross ........................................ | 370/402 |
| 5,515,376 | 5/1996 | Murthy et al. . | |
| 5,825,772 | 10/1998 | Dobbins et al. ......................... | 370/396 |
| 5,949,783 | 9/1999 | Husak et al. ............................ | 370/396 |
| 5,978,378 | 11/1999 | Van Seters et al. .................... | 370/401 |
| 6,014,380 | 1/2000 | Hendel et al. .......................... | 370/392 |
| 6,023,563 | 2/2000 | Shani ...................................... | 395/200.79 |

FOREIGN PATENT DOCUMENTS

WO95/01023  1/1995  WIPO .

OTHER PUBLICATIONS

"Virtual LANs Get Real—Ethernet Switch Makers Are Taking The Lead In Deploying Virtual LANs Across Campus Networks"—Data Communications, vol. 24, No. 3, Mar. 1995, pp. 87–92, 94, 96, 98, 100, XP000496027.

*Primary Examiner*—Douglas W. Olms
*Assistant Examiner*—David R Vincent

[57] ABSTRACT

A network switch configured for switching data packets across multiple ports uses an address table to generate frame forwarding information. A decision-making engine receives a source address, destination address and receive port number along with a virtual local area network (VLAN) ID, if applicable. The decision-making engine searches the address table twice to generate frame forwarding information. The first search is based on the source address and the receive port number of the frame and the second search is based on the destination address and a VLAN index for the received frame. The network switch uses the information generated from the searches to generate the frame forwarding information.

14 Claims, 17 Drawing Sheets

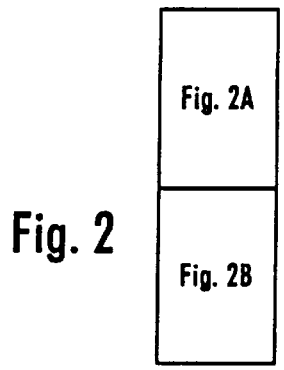
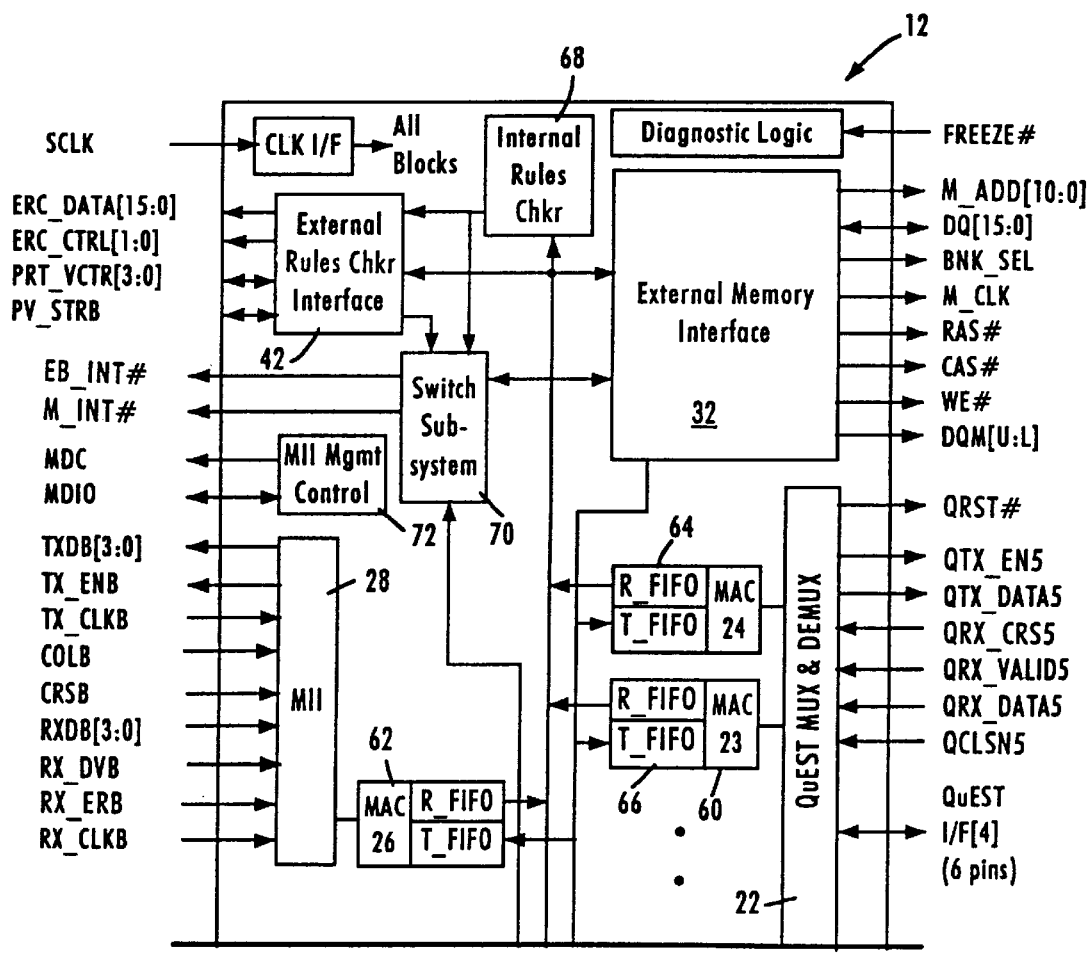
Fig. 2A

Fig. 6  IRC Address Table Entry Format

| ADDRESS | VLAN INDEX | RECEIVE PORT NUMBER | PORT VECTOR |
|---|---|---|---|
| XXX | XXX | XXX | XXX |
| 001 | 100 | 010 | XXX |
| XXX | XXX | XXX | XXX |
| 101 | 100 | XXX | ••• |
| XXX | XXX | XXX | XXX |

IRC ADDRESS TABLE 106

Fig. 8

SHARED ADDRESS TABLE WITH SOURCE AND DESTINATION TWO-PASS ALGORITHM

CROSS-REFERENCE TO RELATED APPLICATIONS

This application claims priority from provisional patent application Ser. No. 60/038,025, filed Feb. 14, 1997, entitled INTEGRATED MULTIPORT SWITCH (attorney docket 1033-230PRO), which is incorporated herein by reference.

This application is related to the following commonly-assigned, copending applications, filed concurrently herewith, entitled: METHOD AND APPARATUS FOR AUTO-INCREMENTING THROUGH TABLE AND UPDATING SINGLE REGISTER IN MEMORY (attorney docket 08/993,834), METHOD AND APPARATUS FOR SCALING NUMBER OF VIRTUAL LANS IN A SWITCH USING AN INDEXING SCHEME (attorney docket 08/993,831), METHOD AND APPARATUS FOR CAPTURING SOURCE AND DESTINATION TRAFFIC (attorney docket 08/993,884), METHOD AND NETWORK SWITCH HAVING DUAL FORWARDING MODELS WITH A VIRTUAL LAN OVERLAY (attorney docket 08/993,835), METHOD AND APPARATUS FOR MANAGING BIN CHAINS IN A MEMORY (attorney docket 08/993,826), APPARATUS AND METHOD FOR GENERATING AN INDEX KEY FOR A NETWORK SWITCH ROUTING TABLE USING A PROGRAMMABLE HASH FUNCTION (attorney docket 08/992,795), METHOD AND APPARATUS FOR CREATING A PORT VECTOR (attorney docket 08/993,044) and METHOD AND APPARATUS FOR MANAGING LEARNING IN AN ADDRESS TABLE IN A MEMORY (attorney docket 08/994,691).

TECHNICAL FIELD

The present invention relates to network communications and more particularly, to searching an address table for making data forwarding decisions.

BACKGROUND ART

In computer networks, a plurality of network stations are interconnected via a communications medium. For example, Ethernet is a commonly used local area network scheme in which multiple stations are connected to a single shared serial data path. These stations often communicate with a switch located between the shared data path and the stations connected to that path. Typically, the switch controls the communication of data packets on the network.

When all of the stations connected to the network are simultaneously operating, packet traffic on the shared serial path can be heavy with little time between packets. In addition, data received by the switch may include data that is being transmitted to a single station (unicast), data that is being transmitted to multiple stations (multicast) or data that is being transmitted to all the stations (broadcast). In order for the data to be transmitted without delays, the switch must make data forwarding decisions for many packets being transmitted to a large number of destinations in a short amount of time.

One arrangement for generating frame forwarding decisions uses a direct addressing scheme, where the network switch accesses a fixed address table in a row-by-row search to generate a frame forwarding decision. However, these direct addressing arrangements may not support data transmissions from stations utilizing virtual local area network (VLAN) tagging as well as transmissions from stations that do not utilize VLAN tagging. In addition, as the number of stations in the network increases, such systems become impractical since a row-by-row search for the appropriate table entry may be too slow for making frame forwarding decisions for multiple received data frames.

SUMMARY OF THE INVENTION

There exists a need for a switching device that generates frame forwarding information for various types of data transmissions, including transmissions that utilize VLAN tags.

There is also a need for a switching device that accesses a single table using an indexing scheme that generates frame forwarding information in a timely manner.

These and other needs are met by the present invention, where data received by the network switch is routed to an internal decision making engine that includes an address table. The internal decision making engine searches the address table, makes the data forwarding decision and outputs the result for data forwarding purposes.

According to one aspect of the invention, a network switch is configured for controlling the communication of data frames between stations. The switch includes a table for storing address information. The address information includes data forwarding information and both source addresses and destination addresses. The switch also includes a control device that receives a source address and a destination address from a data frame and searches the table for data forwarding information, based on the source address and destination address.

Another aspect of the present invention provides a method for generating data forwarding information. The method includes receiving information from the data frames and performing a first search of an address table for an entry having a specified source address and receive port number, based on the received information. A second search of the address table is performed for an entry having a specified destination address and VLAN index. The second entry identifies the data forwarding information.

Other objects and advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

FIGS. 2, 2A and 2B are block diagrams of a multiport switch constructed in accordance with an embodiment of the present invention and used in the packet switched system of FIG. 1.

FIG. 6 illustrates the format of an IRC address table entry of the IRC address table of FIG. 5.

FIG. 8 illustrates an example of the use of the address table in connection with identifying a forwarding port vector.

DETAILED DESCRIPTION OF ILLUSTRATED EMBODIMENTS

The present invention will be described with the example of a switch in a packet switched network, such as an Ethernet (IEEE 802.3) network. A description will first be given of the switch architecture, followed by the detailed description of the internal rules checker. It will become apparent, however, that the present invention is also applicable to other packet switched systems, as described in detail below.

SWITCH ARCHITECTURE

Figure 1:
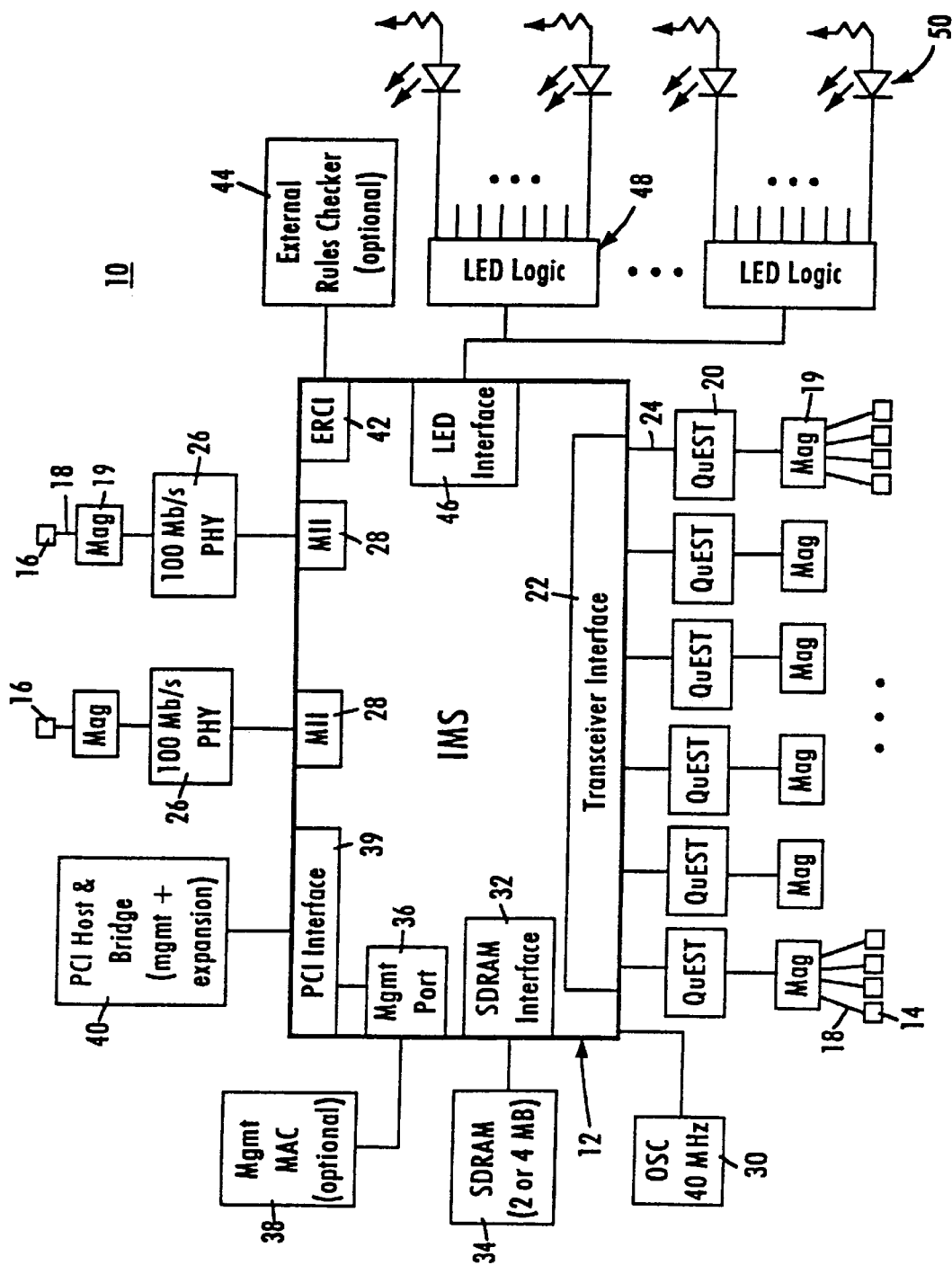
FIG. 1 is a block diagram of a packet switched system in which the present invention may be utilized.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control-Working Draft (0.3). The full-duplex environment provides a two-way, point-to-point communication link between each 100 Mb/s network station 16 and the multiport switch 12, where the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 by a management MAC interface 38. The multiport switch 12 also includes a peripheral component interconnect (PCI) interface 39 enabling access by the management entity via a PCI host and bridge 40. Alternatively, the PCI host and bridge 40 may serve as an expansion bus for a plurality of IMS devices 12.

The multiport switch 12 includes an internal decision making engine that selectively transmits data packets received from one source to at least one destination station. The multiport switch 12 includes an external rules checker interface (ERCI) 42 that allows an external rules checker (ERC) 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 30 provides a 40 MHz clock input for the system functions of the multiport switch 12.

Figure 2B:
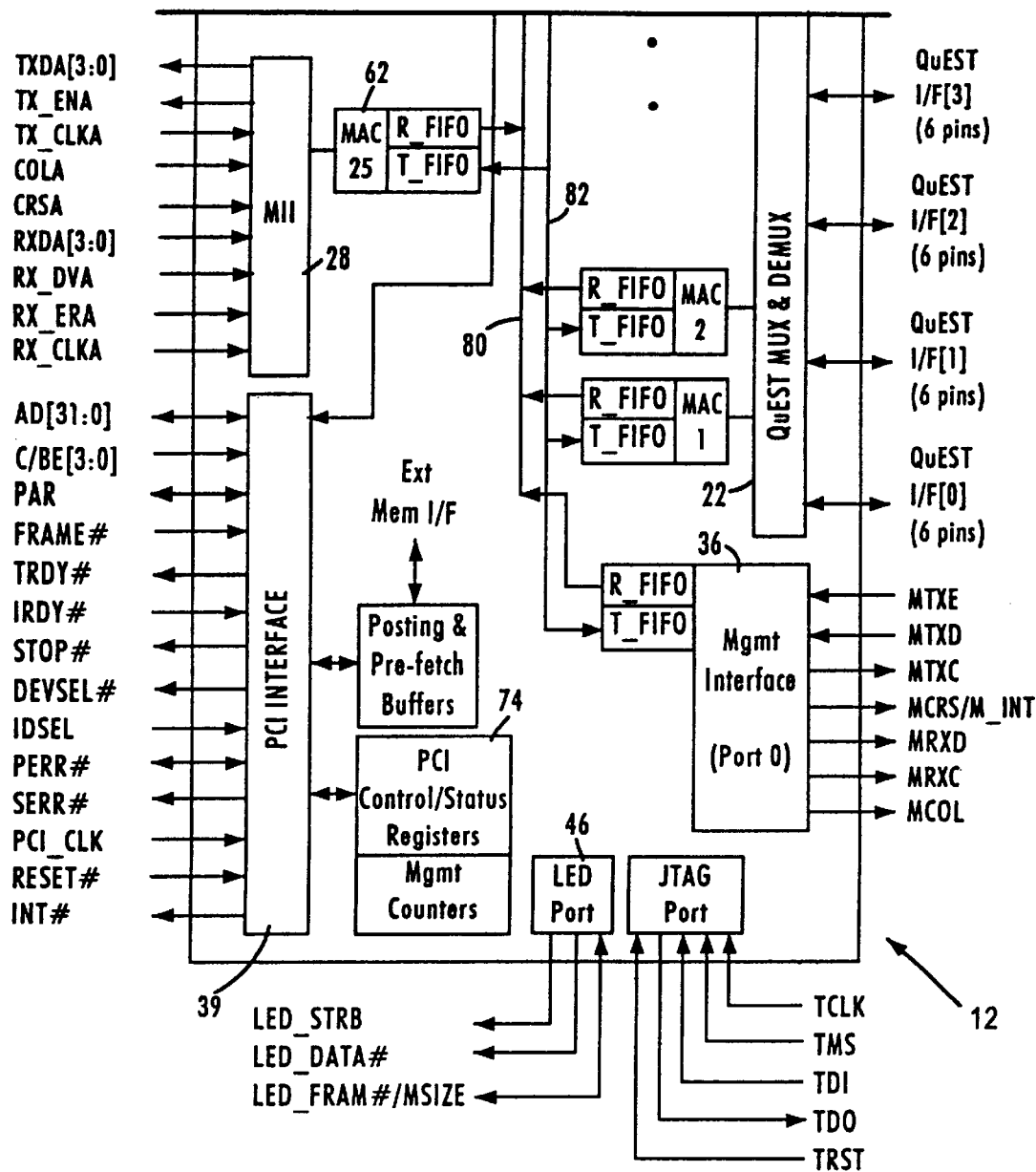

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first-in-first-out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u) . For example, the management data interface 72 outputs a management data clock (MDC) providing a timing reference on the bidirectional management data IO (MDIO) signal path.

The PCI interface 39 is a 32-bit PCI revision 2.1 compliant slave interface for access by the PCI host processor 40 to internal IMS status and configuration registers 74, and access external memory SDRAM 34. The PCI interface can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Figure 3:
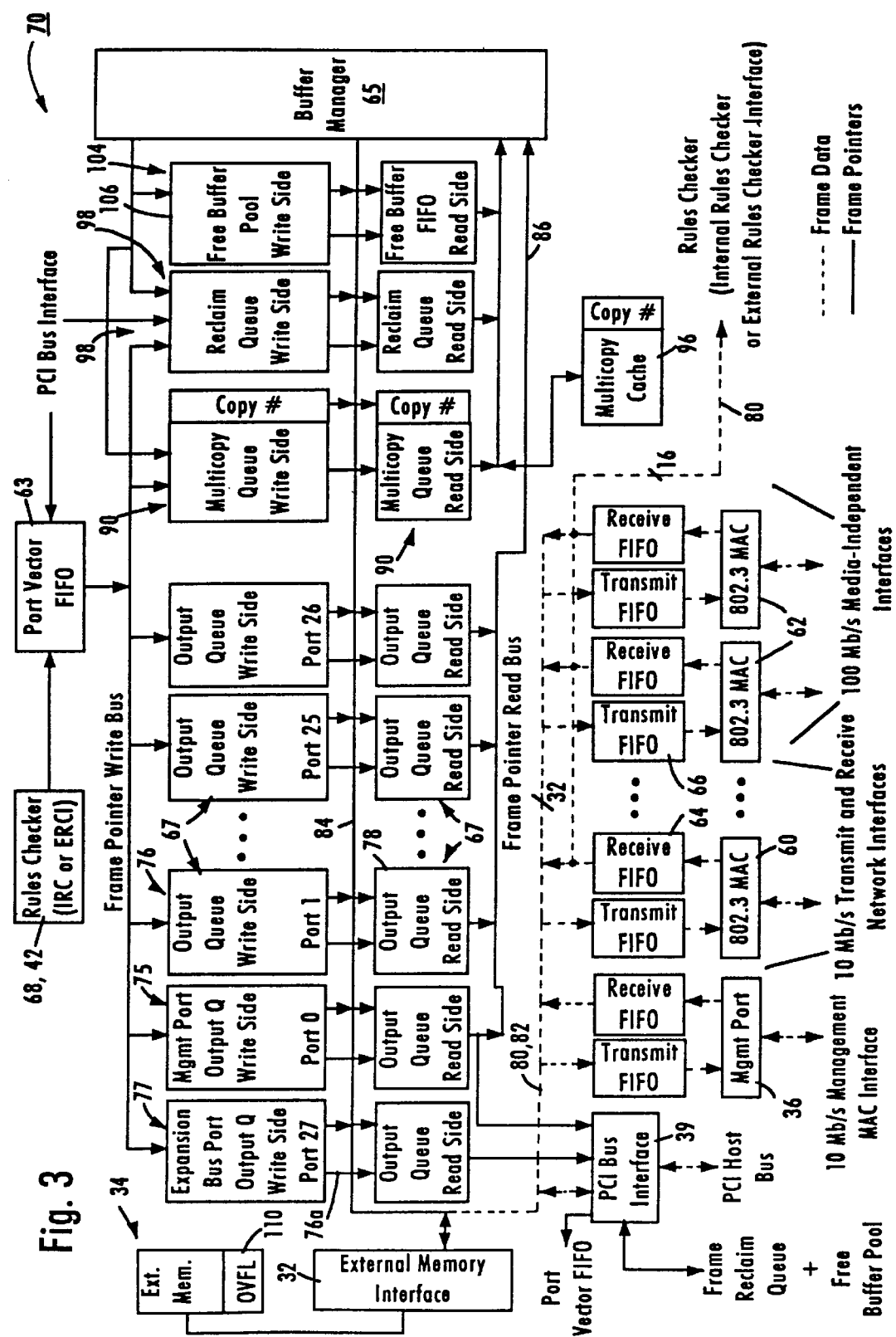
FIG. 3 is a detailed block diagram of the switch subsystem of FIG. 2.

FIG. 3 depicts the switch subsystem 70 of FIG. 2 according to an exemplary embodiment of the present invention. Other elements of the multiport switch 12 of FIG. 2 are reproduced in FIG. 3 to illustrate the connections of the switch subsystem 70 to these other elements. The switch subsystem 70 contains the core switching engine for receiving and forwarding frames. The main functional blocks used to implement the switching engine include: a port vector FIFO 63, a buffer manager 65, a plurality of port output queues 67, a management port output queue 75, an expansion bus port output queue 77, a free buffer pool 104, a multicopy queue 90, a multicopy cache 96 and a reclaim queue 98.

There are two basic types of frames that enter the multiport switch 12 from the ports: unicopy frames and multicopy frames. A unicopy frame is a frame that is received at a port which is to be transmitted by the multiport switch 12 to only one other port. By contrast, a multicopy frame is a frame that is received at one port for transmission to more than one port. In FIG. 3, each port is represented by a corresponding MAC 60, 62, or 36 having its own receive FIFO 64 and transmit FIFO 66.

Frames, whether unicopy or multicopy, are received by the internal MAC engines 60, 62, or 36, and placed in the corresponding receive FIFO 64. Each data frame has a header including at least a destination address, a source address, and type/length information. The header of the received packet is also forwarded to a decision making engine to determine which MAC ports will output the data packet. The multiport switch 12 supports two decision making engines, an internal rules checker (IRC) 68 and an external rules checker (ERC) 44. In order for the ERC 44 to function, the multiport switch 12 sends data to the ERC 44 via the external rules checker interface (ERCI) 42. The ERCI 42 is enabled and disabled via a rules checker configuration register 74 located on the multiport switch 12. The IRC 68 and ERCI 42 do not operate simultaneously. The IRC 68 and ERC 44 provide the decision making logic for determining the destination MAC port(s) for a given data packet. The decision making engine may determine that a given data packet is transmitted to either a single port, multiple ports, or all ports (i.e., broadcast).

INTERNAL RULES CHECKER

The present invention is directed to the use of an address table with the internal rules checker. As described above, the switch subsystem 70 provides the switching logic for receiving and forwarding frames to the appropriate output ports. The forwarding decisions, however, are made by either the IRC 68 located on the multiport switch 12 or the ERC 44 located off the multiport switch 12.

Both the IRC 68 and ERC 44 perform the same functions utilizing the same basic logic. In the normal mode of operation, only one of the two rules checkers is active at any given time. The ERC 44 makes the frame forwarding decisions when the ERCI 42 is enabled. The ERCI 42 is enabled in the rules checker configuration register located with the PCI control/status registers 74. The description that follows assumes that the ERCI 42 is disabled and hence, the IRC 68 makes the frame forwarding decisions.

The multiport switch 12 supports virtual local area networks, or VLANs, for creating logical workgroups of users who may be physically separated from each other. VLAN groupings provide privacy and security to members of the groupings. In addition, VLANs provide "broadcast domains" whereby broadcast traffic is kept "inside" the VLAN. For example, a specific VLAN may contain a group of users at a high level of an organization. When sending data to this group of users, the data may include a specific VLAN identifier associated with this particular group to ensure that only these users receive the data. These VLAN groupings can be thought of as "sub-networks" within a larger network. Among other benefits, VLANs can greatly reduce the time an information systems manager spends processing adds, moves and changes within a network environment.

Figure 4:
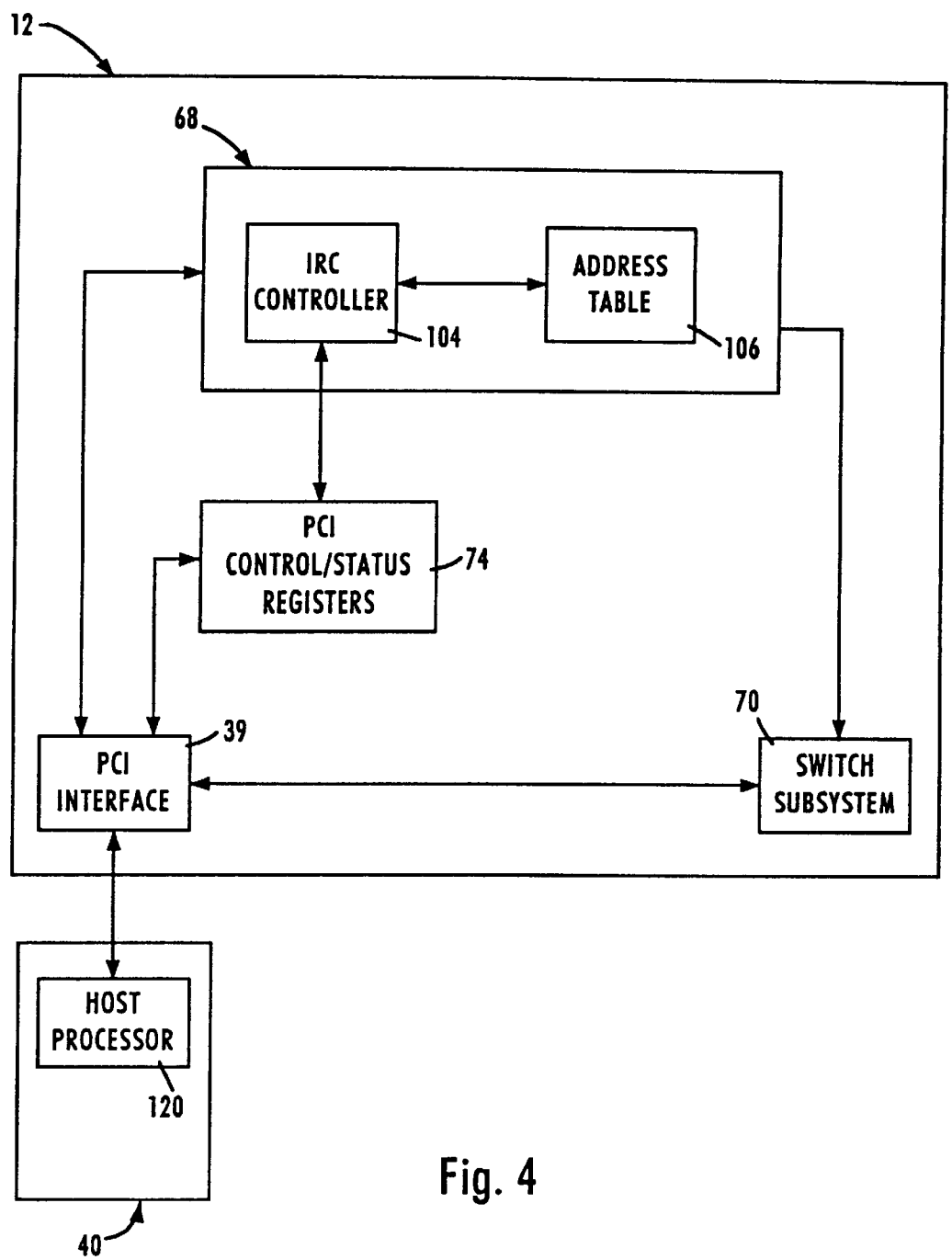
FIG. 4 is a block diagram of a system including the internal rules checker of FIG. 2 in accordance with an embodiment of the present invention.

When the multiport switch 12 receives a frame, it sends the frame pointer (pointing to the location in external memory 34 where the frame is stored), the receive port number, destination address (DA), source address (SA) and VLAN ID (if applicable) to the IRC 68. FIG. 4 illustrates the IRC 68 which includes an IRC controller 104 and address table 106. In the exemplary embodiment, the address table 106 is within the IRC 68. In alternative embodiments, the address table 106 may be located outside the IRC 68 within another part of the multiport switch 12 or even external to the multiport switch 12, as in the case of the ERC 44.

In the exemplary embodiment, a host processor 120 functions as the management agent and is connected to the IRC 68 via the PCI interface 39, which functions as the management port. Alternatively, a management MAC 38 may be connected to the management port 36 to function as the management agent.

In the exemplary embodiment, the address table 106 supports 512 user addresses and capabilities for 32 unique VLANs. However, the number of addresses and VLANs supported may be increased by expanding the table size.

Figure 5:
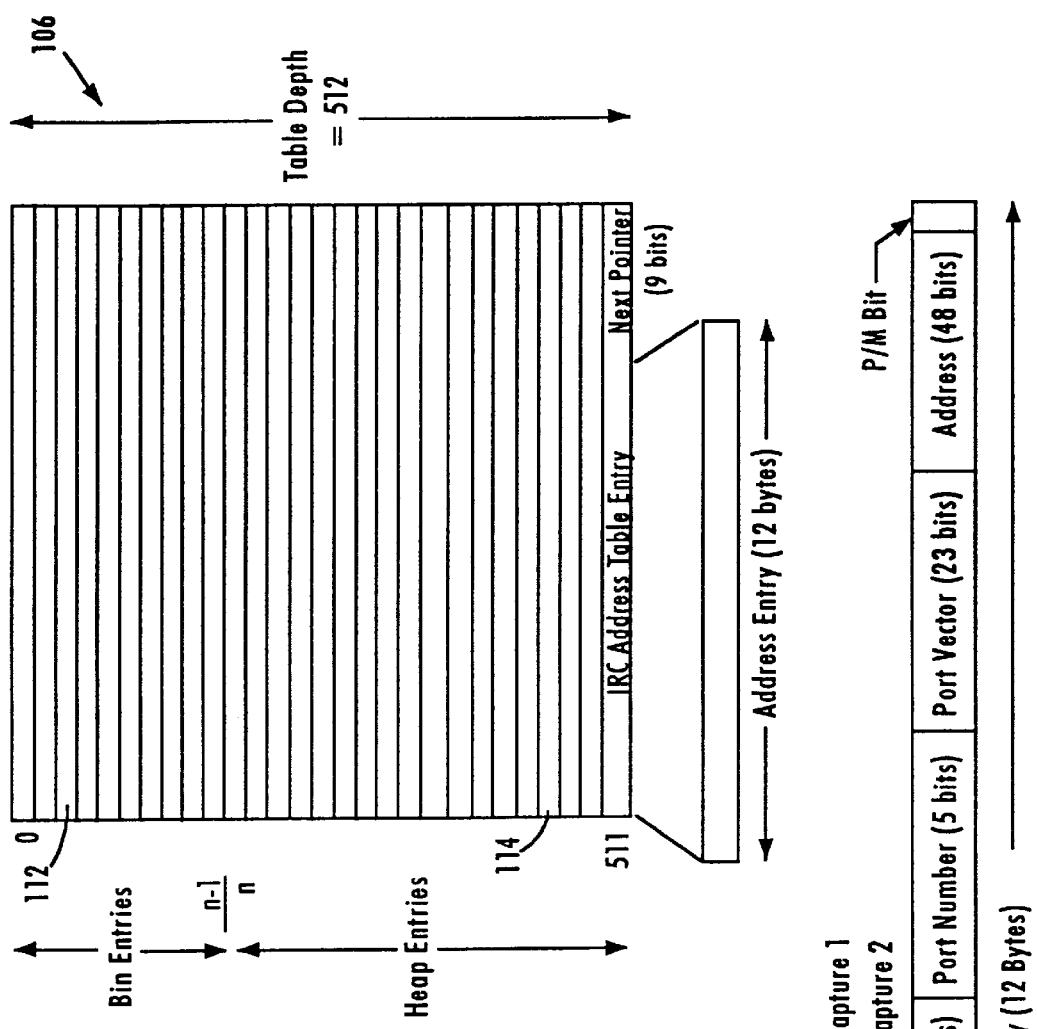
FIG. 5 illustrates the composition of the IRC address table of FIG. 4.

FIG. 5 illustrates an exemplary organization of the IRC address table 106. The IRC address table 106 contains an array of 512 entries. The first "n" entries 108 are referred to as "bin entries" and have addresses from "0" to "n−1". The remaining entries 110 are referred to as "heap entries" and have addresses from "n" to "511". Each of the entries includes a 12-byte address entry and a 9-bit "next pointer" field.

FIG. 6 illustrates the composition of each 12-byte address entry shown in FIG. 5. A valid bit indicates whether the entry is valid to search for a forwarding port vector. If the valid bit is cleared, the address entry is not to be used when searching for a DA/VLAN index match. A hit bit is used for address entry aging. When the IRC 68 finds a source address/receive port number match, the IRC 68 sets the hit bit. The host can read and clear this bit, then periodically poll for a cleared bit, to implement an aging algorithm.

A priority bit indicates frame priority in the output queues. Frame priority is determined during the DA/VLAN index search. If the priority bit is set in the entry where the DA is found, the frame will be queued on the high priority queue. The primary purpose of frame priority is to allow time-sensitive applications to queue data to ports which require a low-latency response.

A VLAN tag disable bit allows the IRC 68 to selectively disable tagging for frames to be forwarded to a tagged 100 Mb/s port. If tagging is enabled on a particular 100 Mb/s port, the VLAN tag disable bit overrides tagging for the particular DA address directed to the 100 Mb/s port.

Source and destination traffic capture 1 and 2 identify traffic capture source and destination MAC addresses for mirroring MAC or port conversations to the management port.

The VLAN index is a 5-bit field used to reference a 16-bit VLAN identifier. The port number identifies the port on which the associated address resides. The port vector provides the forwarding vector for forwarding the data frames.

The address entries include addresses for both source addresses and destination addresses. The addresses can be unicast, multicast or broadcast. A physical/multicast (P/M) bit is also included in the address field.

The host processor 120 is responsible for initializing the values in the address table 106 . Upon power-up, the host loads values into the bin entries 108 based on the network configuration, including VLAN configurations. The heap entries 110 are not fixed at power-up and are used for adding entries to the table. The IRC 68 uses the specific fields of the address table 106 to make frame forwarding decisions, as described in detail below. More specifically, the IRC controller 104 includes control logic to search the address table 106 for frame forwarding information in the form of a port vector. The IRC 68 transmits the port vector along with the frame pointer, VLAN index and a control opcode to the port vector FIFO 63, as shown in FIG. 3.

The multiport switch 12 receives frames from both untagged and tagged ports. All of the 10 Mb/s ports connected to the multiport switch 12 are untagged. The two 100 Mb/s ports may be tagged or untagged. The management ports and expansion bus ports are also untagged. The IRC 68 performs its logic functions for tagged and untagged ports differently.

Figure 7A:
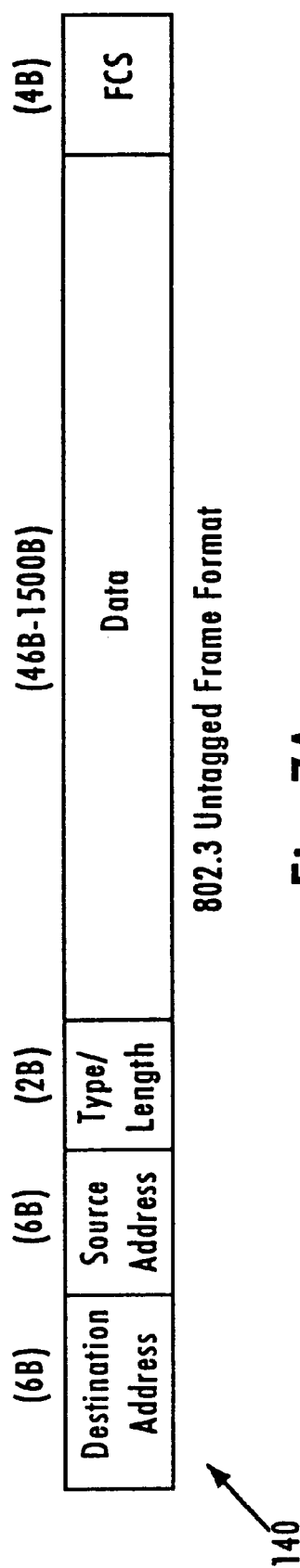
FIGS. 7A and 7B illustrate the format of an untagged frame and a tagged frame, respectively.
Figure 7B:
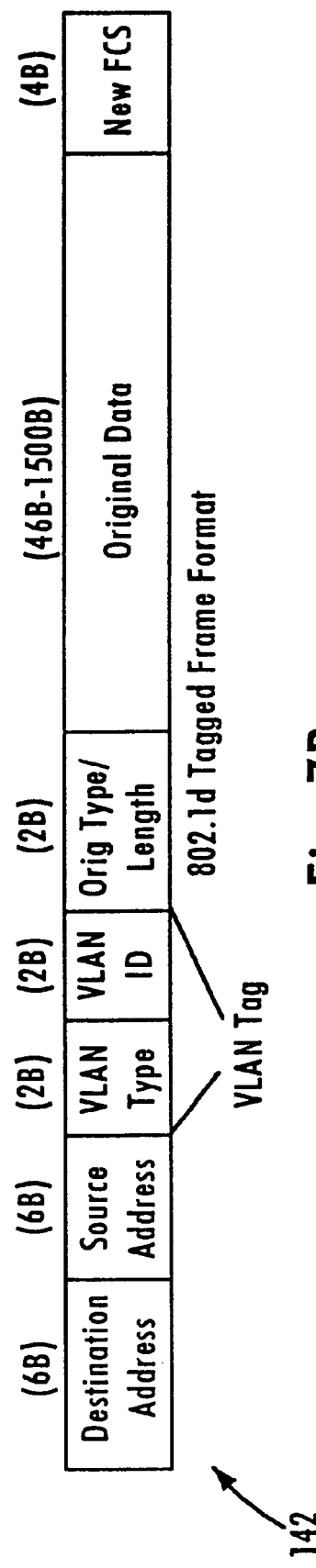

An exemplary network data packet is shown in FIG. 7A for untagged frame format, and FIG. 7B for tagged frame format. Untagged frames, as shown in FIG. 7A are formatted in accordance with IEEE 802.3 and tagged frames are formatted in accordance with IEEE 802.1d. Each untagged frame 140 and tagged frame 142 includes a 6-byte destination address field, a 6-byte source address field, a 2-byte type/length field, a variable length data field having a field width of 46 bytes to 1500 bytes, and a 4 byte frame check sequence (FCS) field. Each tagged frame 142 also includes a VLAN tag including a 2-byte VLAN Ethertype field and a 2-byte VLAN ID field. A s recognized in the art, both the untagged frame and the tagged frame will be preceded by a 56-bit preamble, and an 8-bit start frame delimiter (SFD).

The host processor 120 maps the 16-bit VLAN IDs into 5-bit VLAN indexes in a VLAN index-to-identifier (ID) table. In this manner, the entire 16-bit VLAN identifier does not have to be transmitted with the frame forwarding information to the port vector FIFO 63. Instead, only a 5-bit VLAN index is transmitted along with the frame forwarding information, thereby saving data transmission time. In the exemplary embodiment, the VLAN index-to-ID table is located with the PCI control/status registers 74. Alternatively, the VLAN index-to-ID table may be located in the IRC 68.

A detailed description of IRC operations for processing data from untagged ports is described below, followed by a detailed description of IRC operations for tagged ports.

When the multiport switch 12 receives a frame from an untagged port, the receive MAC 60 strips off the DA and SA and sends this information to the IRC 68 along with the receive port number and frame pointer. The IRC controller 104 searches the address table 106 twice: once for an SA and receive (RX) port number match (to find a VLAN index) and once for a DA and VLAN index match (to find a forwarding port vector) . The searches occur as follows:

Search 1: (SA, RX Port Number)=>VLAN Index

Search 2: (DA, VLAN Index*)=>Forwarding Port Vector

* VLAN Index found during Search 1

FIG. 8 illustrates an example of the search of the address table 106 by the IRC controller 104. For simplicity, this example illustrates only a portion of the address table and each field is shown as consisting of only three bits. However, in the exemplary embodiment, the address field is actually 48 bits and the port number field is five bits. In FIG. 8, the "X"s represent any given data stored by the host in the table.

Assume that the SA for a received frame is "001" and the receive port number is "010". The IRC controller 104 searches the address table and finds a SA/receive port number match at the second address entry. The VLAN index at this entry is "100".

The IRC controller 104 uses this VLAN index, "100", in a second search of the address table. For simplicity, assume that the DA of the received frame is "101". The IRC controller 104 searches the address table and finds a DA/VLAN index match at the fourth address entry. The port vector at this address entry (indicated by asterisks) contains the forwarding decision information necessary for forwarding the data frame. Specifically, the port vector in the exemplary embodiment is a 28-bit vector with a bit for set for each output port identified as a destination port to which the data frame should be forwarded. The 28-bit vector includes one bit for each of: the 24 10 Mb/s ports, two 100 MB/s ports, management port and expansion port. For example, for a unicopy frame only one bit corresponding to the one destination port is set in the port vector. For a broadcast frame, the port vector consists of all "1's", indicating that the frame will be transmitted to all the ports. However, in the exemplary embodiment, the IRC controller 104 masks out the bit in a port vector representing the port from which the data frame is received. This avoids sending a data frame back to the port on the multiport switch 12 from which it was received.

The IRC controller 104 sends the forwarding port vector along with the frame pointer, VLAN index identified in search 1 and a control opcode to the port vector FIFO 63 for forwarding the data frame to the appropriate output port(s). The control opcode includes various control information associated with traffic capture, the IRC address and the management port/tagging.

When frames are received from a tagged port, the frame may or may not contain a VLAN tag. The receive MAC 62 checks the frames for VLAN tags. If a frame contains a VLAN tag, the receive MAC 62 strips the VLAN identifier in the tag and writes the VLAN identifier to the buffer header of the first buffer in external memory 34 used to store the frame's data. The IRC 68 checks whether the tagged port's received frame contains a VLAN type which matches the VLAN type in a VLAN Ethertype register. The VLAN Ethertype field is assigned according to IEEE standards. When the VLAN type in the received frame does not match the contents of the VLAN Ethertype register, the IRC 68 assumes the frame is untagged. In the exemplary embodiment, the VLAN Ethertype register is located with the PCI control/status registers 74. Alternatively, the VLAN Ethertype register may be located in the IRC 68.

As discussed above, when the multiport switch 12 port receives a frame from a tagged port, it may or may not contain a VLAN tag. In either case, the receive MAC 62 sends the receive port number, frame pointer, DA and SA to the IRC 68. If the VLAN tag is present, the VLAN tag is also sent to the IRC 68. However, the IRC 68 operates differently depending on whether the tag is present.

When a VLAN tag is present, the IRC controller 104 uses the VLAN ID contained in the received frame and searches the VLAN index-to-ID table for a VLAN ID match. If a match occurs, the associated VLAN index is assigned to the frame. The IRC 68 then searches the address table for the SA/receive port number using the same searching method as performed for untagged frames, discussed above. However, the IRC controller 104 does not "police" the VLAN index identified in the VLAN index-to-ID table, based on the received VLAN ID, by comparing it to the VLAN index found in the SA/Rx port number search. The IRC controller 104 uses the VLAN index found in the VLAN index-to-ID table and performs a DA/VLAN index search, as described above. The IRC controller 104 identifies the forwarding port vector from the matched DA/VLAN index search.

The IRC controller 104 sends the forwarding port vector along with the frame pointer, VLAN index from the VLAN index-to-ID table and a control opcode to the port vector FIFO 63 for forwarding the data frame to the appropriate output port(s), in the same manner as for data from untagged ports.

When a VLAN tag is not present in a data frame received from a tagged port, the IRC 68 executes an SA/receive port number search to find a VLAN index and then executes a DA/VLAN index search to obtain a port vector as described above for untagged frames. The IRC controller 104 also sends the forwarding port vector along with the frame pointer, VLAN index and a control opcode to the port vector FIFO 63 for forwarding the data frame to the appropriate output port(s), in the same manner as for data from untagged ports.

In the present invention, the time spent searching the address table for a SA/receive port number match and then for a VLAN index/DA match in the manner discussed above (for both untagged and tagged ports) may be time consuming. In certain situations, searching the entire address table of 512 address entries may result in unacceptable delays in the network.

The time spent searching the address table may be reduced by searching only a subset of the address entries. The IRC controller 104 of the present invention saves processing time by performing a programmable hash function in the receive MAC 60 or 62.

Figure 9:
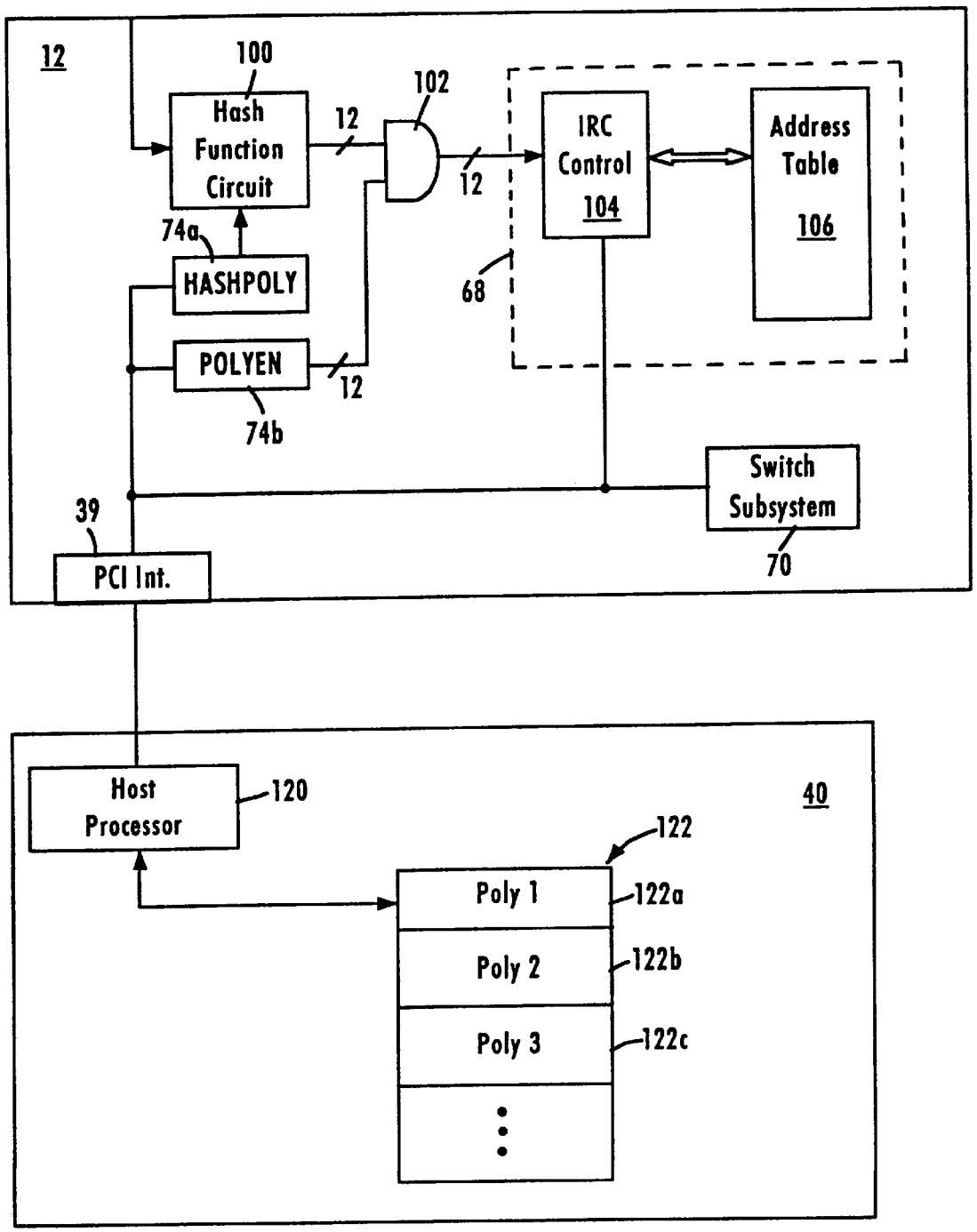
FIG. 9 is a block diagram of a system including the internal rules checker of FIG. 2 using programmable hash functions.

FIG. 9 is a block diagram illustrating the functional components of the multiport switch 12 and the host 40 associated with searching the address table using programmable hash keys.

As described above, the multiport switch 12 needs to make frame forwarding decisions relatively quickly, since multiple data frames may be received by the multiport switch 12 simultaneously. Hence, the present invention may use a hashing scheme, where the address information from the header of a received data packet is processed using a hashing function, described below, to obtain index information.

As shown in FIG. 9, the multiport switch 12 includes a hash function circuit 100 configured for generating a hash polynomial h(x) for the address of the data packet according to a user-specified hash function. The user-specified hash function, stored in a user-programmable register (HASHPOLY) 74a, includes a 12-bit value defining the hash polynomial used by the hash function circuit 100, described in detail below. The hash polynomial output by the hash function circuit 100 is output to a logic circuit, for example a 12-bit parallel AND gate, that selectively outputs the lower significant bits of the hash-generated polynomial based upon a polynomial enable value (POLYEN) stored in register 74b. The field "POLYEN" defines how many bits of the hash polynomial are used to create the bin number, and preferably having a maximum value of seven (7). For example, if POLYEN=5, then the multiport switch uses the lower 5 bits of the output of the hash key (i.e., h(address)) after hashing on the address. Hence, the hash key output by the logic circuit 102 is based upon masking the 12-bit hash-generated polynomial output by the hash function circuit 100 using the stored register value POLYEN in register 74b to obtain a hash key having a prescribed number of bits corresponding to the number of bin entries, described below.

As shown in FIG. 9, the hash function circuit 100 and the logic circuit 102 are separate from the internal rules checker 68. The hash function circuit 100 and the logic circuit 102 may be implemented separately within the multiport switch 12, or may be incorporated within the functionality of each MAC port 60 or 62. Alternatively, the hash function circuit 100 and the logic 102 may be incorporated as part of the internal rules checker 68. Moreover, it will be appreciated that the programmable hashing described herein may be applied to the external rules checker 44, as desired.

As shown in FIG. 9, the internal rules checker 68 includes an internal controller 104 and a network address table 106, described in detail above and with reference to FIG. 4. The controller 104 accesses the address table 106 based upon the supplied hash key from the logic circuit 102 in order to obtain the necessary information to make a forwarding decision based upon the source address, receive port, destination address, and VLAN associations. Once the necessary forwarding information has been obtained, the controller 104 outputs a port vector to the switch subsystem 70, which outputs the received data packet to the appropriate ports based upon the information in the port vector.

The address table of FIG. 9 is the same address table described in detail with reference to FIG. 5. The address table 106 consists of 512 address entries including a first addressable range 108 of bin entries, and a second addressable range 110 of heap entries. The memory structure of FIG. 5 provides an indexed arrangement, where a given network address will be assigned to a corresponding bin. In other words, each bin entry 112 is configured to reference a plurality of table entries (i.e., heap entries) 114. Hence, the controller 104 performs a search of the address table 106 by first accessing a specific bin 112 pointed to by the hash key, and then searching the entries within (i.e., referenced by) the corresponding bin to locate the appropriate match.

Each bin entry 112 is the starting point for the search by the IRC controller 104 for a particular address within the address table 106. A bin entry may reference no addresses (i.e., be empty), may reference only one address within the bin entry location, or may reference a plurality of addresses using a linked list chain structure.

Figure 10:
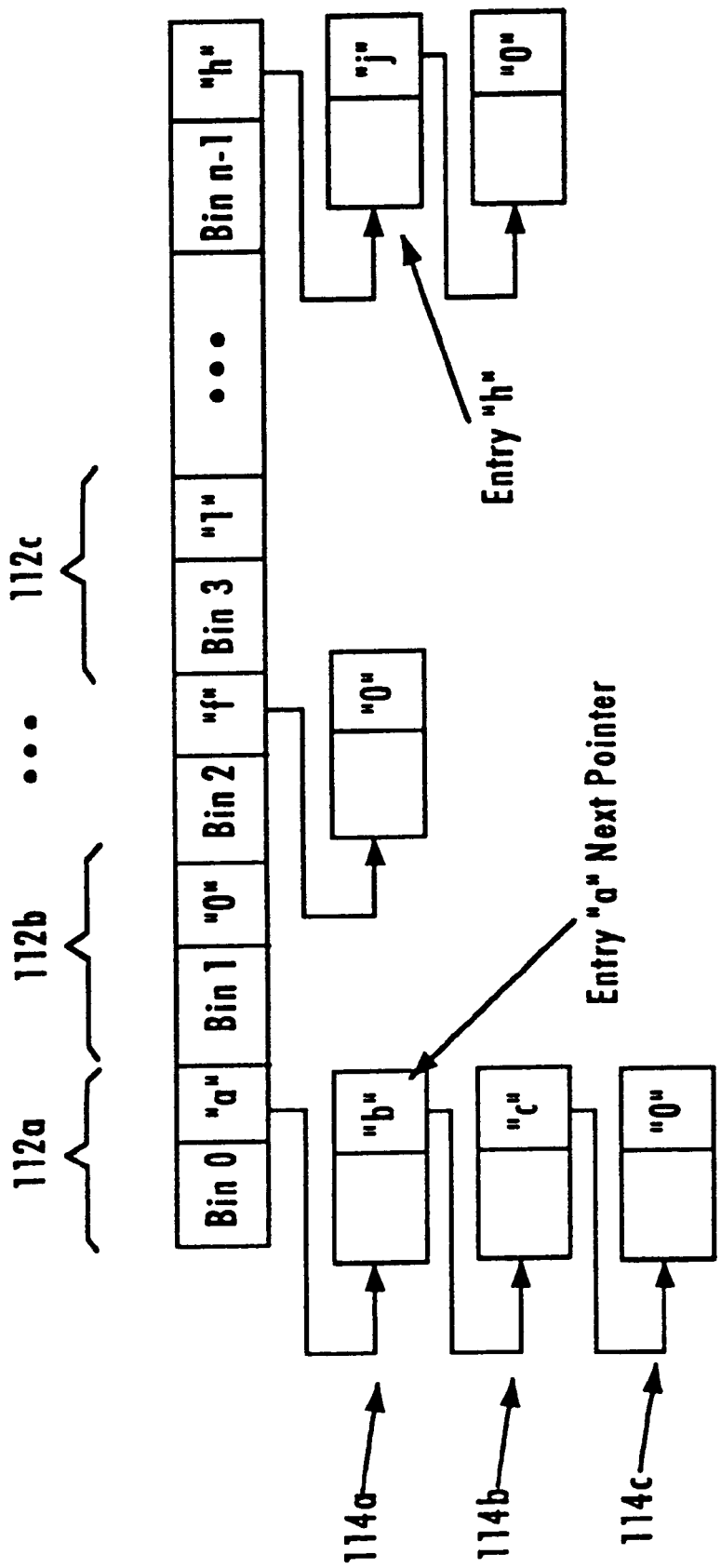
FIG. 10 illustrates linked list chains for identifying table entries relative to a selected bin.

FIG. 10 is a diagram illustrating bin entries referencing a different number of table entries. Each of the bin entries 112 and heap entries 114 includes a 12-byte address field and a 9-bit "next pointer" field. The "next pointer" field associated with the bin entry 112 identifies the location of the next entry in the chain of linked list addresses. For example, Bin 3 112c of FIG. 10 does not have any associated table entries. In such a case, the 12-byte address entry equals zero (or another null value), and the bin's corresponding "next pointer" field will have a value of "1", indicating no entries for the corresponding bin. If a bin such as bin 1, 112b, contains a single table entry, the bin entry will store the switching logic data for that single address in its address entry field, and store the value "zero" in the "next pointer" field, indicating there are no further address entries in the chain. Bin 0, 112a, however, references four addresses by using the "next pointer" field to identify the location of the next entry in the chain. The additional entries 114b and 114c in the bin are linked in no particular order into a linear list, as shown in FIG. 10. Thus, the first entry of Bin 0 is stored in the address entry field of the bin entry 112a and the next entry (heap entry 114a) is referenced by address entry "a" in the next pointer field of the bin entry 112a.

As described above, it is desirable to provide an even distribution of incoming network addresses across the available bin entries. Depending upon the number of bins that are programmed by the value POLYEN in register 74b, there will be a distribution of addresses across all the bins, such that the number of addresses in each bin is generally uniform, enabling the amount of time required to search for a specific address field to be controlled to a finite value. For example, if each bin had fifteen entries, then the IRC controller 104 would only need to search the fifteen entries of a bin, as opposed to searching for 512 entries, where the bin is identified based upon the corresponding hash key.

However, different hash functions may generate different distribution results, causing certain hash functions to map more addresses to one bin than another bin, depending upon the nature of the network addresses. Hence, certain hash function values may be inappropriate for a certain set of network addresses.

The disclosed embodiment enables monitoring of the number of table entries for a given bin, such that the hash function circuit 100 is selectively reprogrammed by rewriting the HASHPOLY value in register 74a with another value specifying another user-specified hash function. Specifically, the host 40 of FIG. 3 includes a host processor 120 that monitors the number of table entries for each bin. The host 40 also includes a nonvolatile memory 122 that stores a plurality of hash configuration values specifying respective available hash functions. The host processor 120 monitors the bin entries for the number of corresponding table entries, and selectively reprograms the HASHPOLY value stored in register 74a with another one of the available hash function values stored in registers 122a, 122b, 122c, etc. in response to the number of table entries exceeding a prescribed threshold.

The programmable hash polynomial is based upon a 12-bit value representing the coefficients of a 12th order polynomial. Hence, the HASHPOLY register value of "0000 1001 1001" (loaded from host memory 122a) corresponds to the hash polynomial $h(x)=X^{12}+X^7+X^4+X^3+1$, the HASHPOLY register value of "0000 0101 0011" (loaded from host memory 122b) corresponds to the hash polynomial $h(x)=X^{12}+x^6+x^4+x+1$, and the HASHPOLY register value of "0001 0011 0001" (loaded from host memory 122c) corresponds to the hash polynomial $h(x)=x^{12}+x^8+x^6+x^5+1$. The term $x^{12}$ is assumed to always equal "1," and hence is not stored in the HASHPOLY register. These hash polynomials are preferred because they are primitive polynomials, although other polynomials may be used for the hash polynomial.

Hence, the host processor 120 monitors the structure of the address table 106, and determines the number of table entries 114 for a given bin entry 112. If the number of entries in any bin exceeds a prescribed threshold (e.g., sixteen table entries in a bin), the processor 120 could reprogram the HASHPOLY register 74a with a new hash polynomial.

Figure 11:
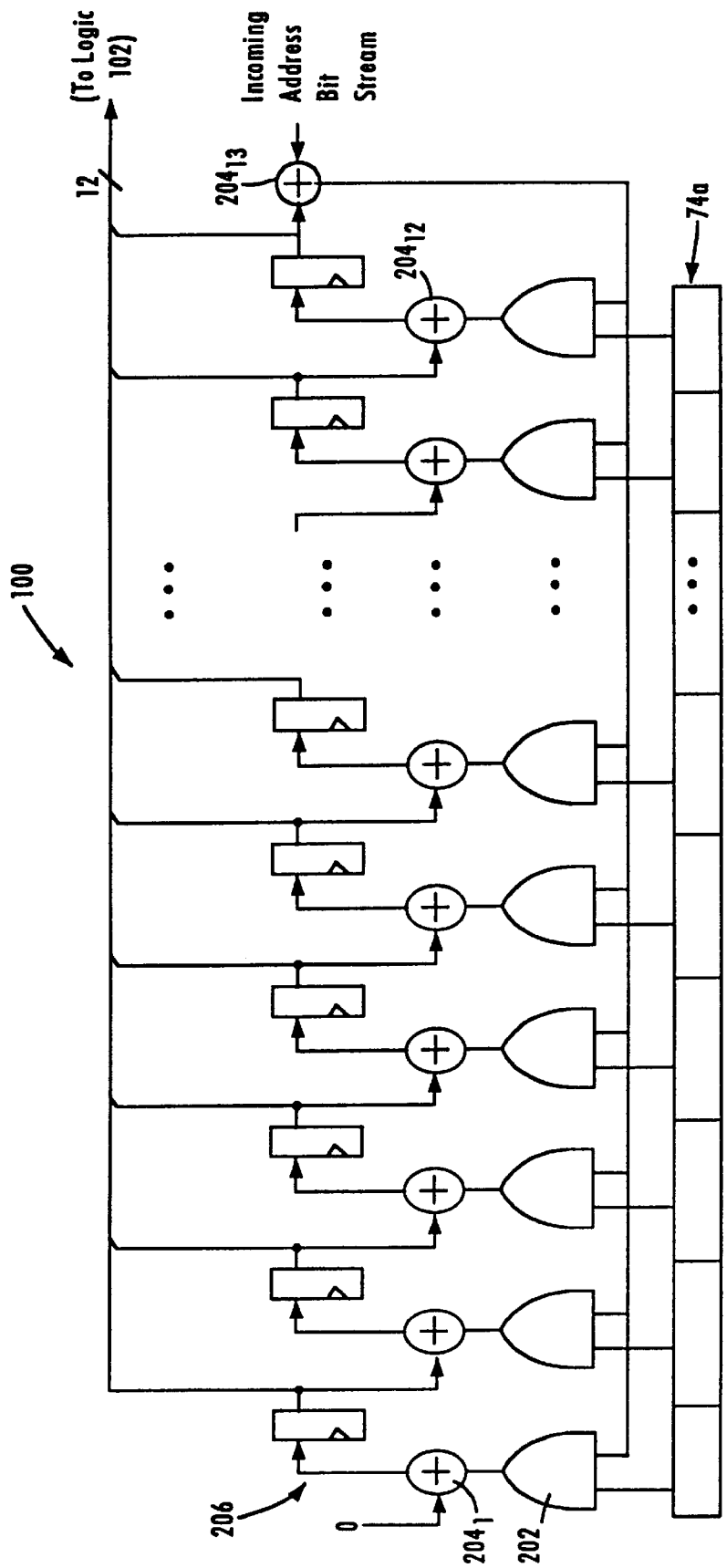
FIG. 11 illustrates the hash function circuit of FIG. 9.

FIG. 11 is a block diagram illustrating a hash polynomial generator 100 as a serial hardware implementation of the programmable hash polynomial h(x). It will be recognized in the art that a similar parallel hardware implementation may be used for the programmable hash polynomial h(x). The hash polynomial generator 100 includes a series of AND gates 202, a series of exclusive OR gates (XOR) 204, and a shift register 206.

The hash polynomial generator 100 is configured by the programmable hash polynomial h(x) by receiving the bit-by-bit outputs from the HASHPOLY register 74a. Hence, each bit of the HASHPOLY register 74a drives a corresponding AND gate 202, such that a bit having a value of "1" in the HASHPOLY register 74a sets the output of the corresponding AND gate 202 equal to the bit stream value output from the XOR gate $204_{13}$.

The host 40 or management entity then programs the number of bins by setting a field "POLYEN" within a hash function configuration register 74b. The field POLYEN specifies the addressable bin range, and hence can be used as a mask for the hash polynomial to generate the appropriate hash key. Hence, the multiport switch will use only the lowest bits of the 12-bit hash function output to identify the bin. The selected bin will fall within the range of bins [0, N−1], where N=$2^{POLYEN}$.

Hence, the host reprograms the hash key periodically by reprogramming the hash function register 74a. The host processor 120 reprograms the hash key by clearing the address table. The host processor 120 then changes the hash function by reprogramming the hash function register 100, and then allows the internal rules checker to relearn the addresses into new bin. Alternatively, the host can perform the new hash function in software, and load the address table with the new address table entries based on the new hash function.

Hence, the disclosed embodiment enables the hash function to be programmable on a network by network basis. The host can reprogram the HASHPOLY register 74a by storing a set of preferred hash polynomials, and selecting a new polynomial from the set of preferred hash polynomials in response to detecting the number of entries in a bin exceeding the prescribed threshold. Hence, the disclosed arrangement enables the hash key generation to be optimized for different network configurations.

The operation of the multiport switch 12 described above considers the reception of data frames from both untagged and tagged ports. The description above assumes that the IRC 68 finds the SA/receive port number match and the DA/VLAN index match in the address table 106, using the hashing scheme described above, and forwards the appropriate port vector to the port vector FIFO 63. However, data may be received by the multiport switch in which one or both of the address table searches results in no match. This may be due to a new station that is added to the network after the host has initially configured the address table 106.

When the IRC 68 receives a frame from an untagged port and cannot find the frame's SA/Rx port number match in the address table 106, the IRC 68 notifies the management port. As discussed above, the host processor 120 functions as the management agent in the exemplary embodiment. Therefore, the IRC 68 notifies the host processor 120 via the PCI interface 39 when the SA/Rx port number match is not found. Depending on how the IRC 68 is programmed in the rules checker configuration register 74, the IRC 68 may: 1) not learn the address, 2) learn the address or 3) learn the address and auto-validate the address entry. The host, via the rules checker configuration register, sets which of the three modes the IRC 68 will operate.

Figure 12:
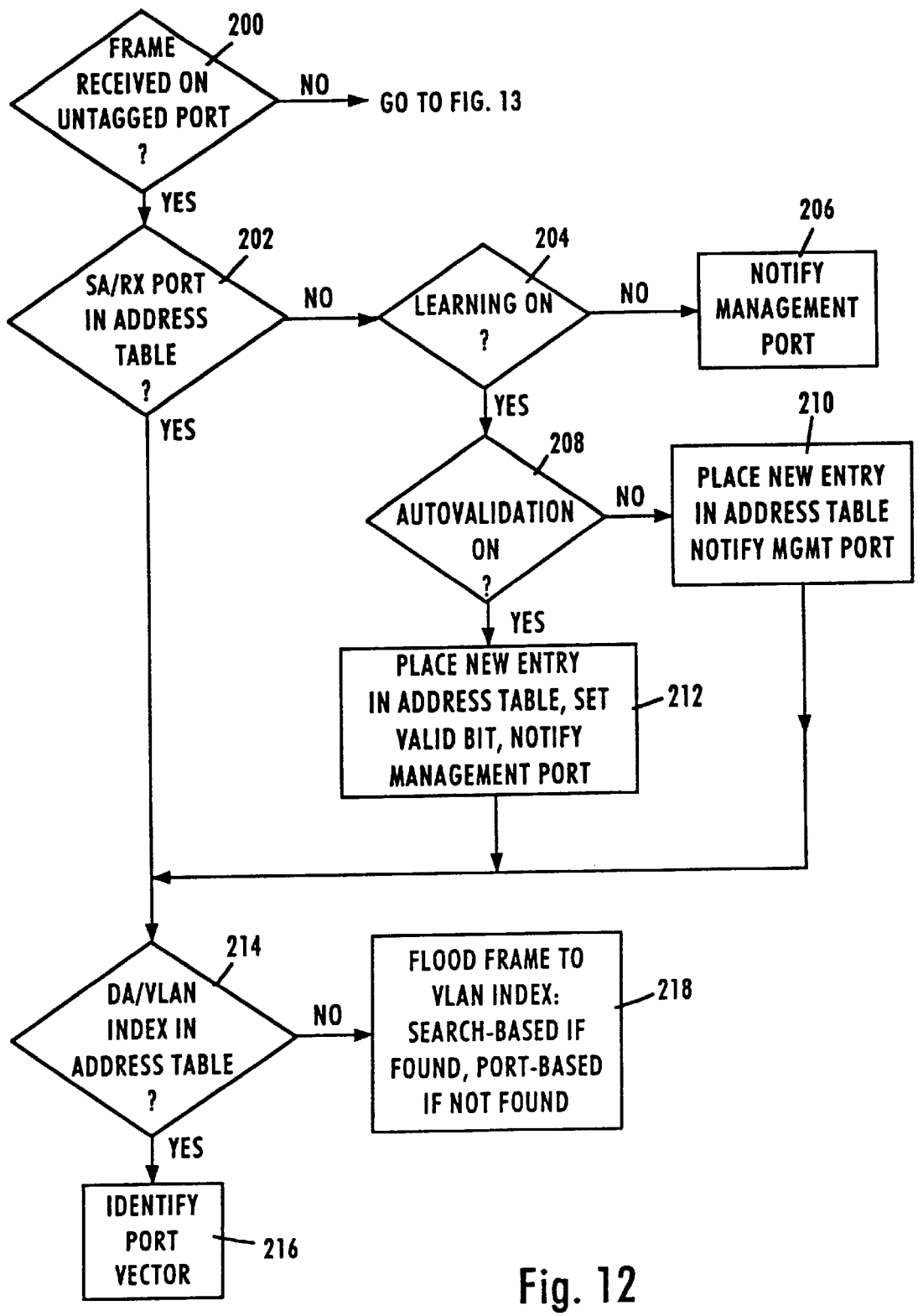
FIG. 12 is a flow diagram illustrating the operation of the IRC for the reception of data from an untagged port.

FIG. 12 is a flow diagram illustrating the operation of the IRC 68 for the reception of data from an untagged port when one or both of the searches is unsuccessful, that is, a match is not found in the IRC address table 106.

Upon the reception of data, the receive MAC 60 determines whether the frame is received from an untagged port at step 200. If the frame is from an untagged port, the IRC controller 104 performs the SA/Rx port number search of address table 106, at step 202. If the SA/Rx port number is not found in the address table 106, the IRC controller 104 determines whether learning is enabled in the rules checker configuration register, at step 204. If learning is not enabled, the IRC sends the frame, receive port number and a control opcode, indicating that the SA was not learned, to the management port at step 206. The IRC does not forward the frame to any other output port and the IRC does not place a new address entry into the address table.

If learning is enabled, the IRC 68 checks whether auto-validation is also enabled in the rules checker configuration register at step 208. If auto-validation is not enabled, the IRC 68 places a new entry into the address table 106 with the receive port number and a receive port-based VLAN index. The receive port bit is set in the port vector and the valid bit is cleared. The receive port-based VLAN index is stored in a VLAN port-to-index table located with the PCI control/status registers 74. In an alternative configuration, the VLAN port-to-index table may be located in the IRC 68. There are 28 5-bit entries in the VLAN port-to-index table. Each 5-bit entry associates a VLAN with a given port, including the management port (port 0) and the expansion bus port (port 27).

The IRC 68 also sends the frame, receive port number, bin number, entry number and a control opcode, indicating that the SA was learned, to the management port, at step 210. The management port receives this information so that the host processor 120 can keep track of changes made to the address table 106. The IRC 68 can use the new address entry in future searches for an SA/Rx port number to find a VLAN index, but it cannot be used in a search for a DA/VLAN index match to find a forwarding port vector. The management agent must validate the address entry before the entry can be used in the DA/VLAN index search.

If the IRC controller 104 determines that autovalidation is enabled ("ON"), at step 208, the IRC 68 places a new entry into the address table 106 as described above in step 210. However, the IRC 68 sets the valid bit in the new entry. As a result, the address can be used in a search for an SA/Rx Port number to find a VLAN index and it can be also be used in a search for a DA/VLAN index to find a forwarding port vector. The IRC 68 sends the frame, receive port number, bin number, entry number and a control opcode, indicating that the SA was learned, to the management port at step 212.

The IRC controller 104 performs the DA/VLAN index search to identify a port vector, at step 214. The VLAN index used in the search is either the matched entry's VLAN index found at step 202 or the receive port-based VLAN index identified in the VLAN port-to-index table. If the IRC controller 104 finds the DA/VLAN index match, the forwarding port vector is identified at step 216. If the IRC controller 104 cannot find a DA/VLAN index match in the address table, the IRC 68 transmits the frame to all members of the VLAN index. This transmission is known as "flooding" the frame. The VLAN index used by the IRC 68 to "flood" the frame is the VLAN index found in the address table (if the SA/Rx Port number was found) or the port-based VLAN index (if the SA/Rx port number was not found).

The VLAN index references a 28-bit vector in a VLAN index-to-flood and broadcast vector table, located with the PCI control/status registers 74. In an alternative configuration, the VLAN index-to-flood and broadcast vector table are located in the IRC 68. There are 32 28-bit entries in the VLAN index-to-flood and broadcast vector table. Each 28-bit entry corresponds to a particular VLAN. If a DA/VLAN entry is not found in the IRC address table 106, the VLAN index-to-flood and broadcast vector table provides the port vector to which the frame should be "flooded".

The VLAN index-to-flood and broadcast vector table also includes a bit to disable the expansion bus port and a bit to disable the management port for limiting "broadcast storms" in the case of receiving a broadcast destination address (i.e., all 1's). The host 120 prevents the multiport switch 12 from "flooding" broadcast frames by programming the VLAN index-to-flood and broadcast vector table to forward to all ports enabled in the flood vector except for the management port and/or the expansion bus port when a broadcast DA and VLAN index match is not found. The disable expansion bus port and disable management port bit mask the expansion bus port and the management port in the flood vector. When these bits are set, flooding to these ports is disabled. This allows flooding to the management and expansion bus ports for unicast and multicast frames, but not broadcast frames. The host 120 initializes the VLAN index-to-flood and broadcast vector table at power-up.

Figure 13:
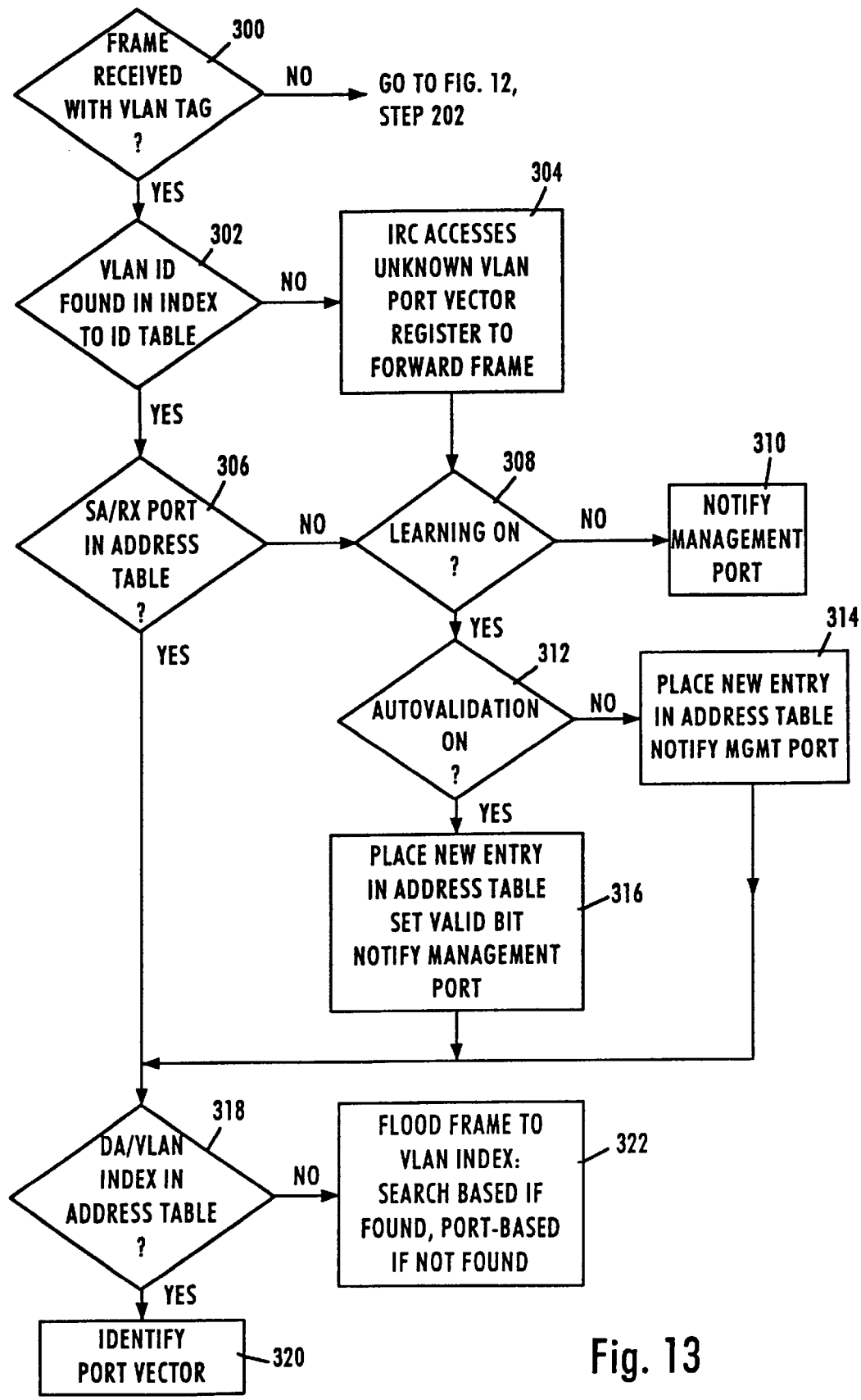
FIG. 13 is a flow diagram illustrating the operation of the IRC for the reception of data from a tagged port.

FIG. 13 is a flow diagram illustrating the operation of the IRC 68 for the reception of data from a tagged port when one or both of the searches is unsuccessful, that is, a match is not found in the IRC address table 106.

Upon the reception of data from a tagged port at step 300, the receive MAC 62 determines whether the frame has a tag. If the frame has no tag, the IRC 68 performs the same operations discussed above for data from untagged ports.

If the frame has a tag, the IRC controller 104 checks the VLAN index-to-ID table at step 302 to determine whether the frame's VLAN ID is known. If the IRC controller does not find the VLAN ID in the table, the IRC controller 104 uses the port vector stored in the unknown VLAN port vector register to forward the frame, at step 304. The unknown VLAN port vector is stored in the unknown VLAN port vector register located with the PCI control/status registers 74. In an alternative configuration, the unknown VLAN port vector register may be located in the IRC 68. The unknown VLAN port vector may contain a bit set for any port, including the management port and expansion bus port. The unknown VLAN port vector is set by the host. When the unknown VLAN port vector contains a bit set for a tagged port, the management port or the expansion bus port, the "unknown" VLAN ID from the received frame will be inserted into the outgoing frame. If the VLAN ID is not known, the IRC 68 continues processing the frame for learning purposes, as described below in step 308.

If the IRC controller 104 finds the VLAN ID at step 302, the IRC controller 104 performs the SA/Rx port number search of address table 106, at step 306. If the SA/Rx port number is not found in the address table 106, the IRC controller 104 determines whether learning is enabled in the rules checker configuration register, at step 308. If learning is not enabled, the IRC 68 sends the frame, receive port number and a control opcode, indicating that the SA was not learned, to the management port at step 310. The IRC 68 does not forward the frame to any other output port and the IRC 68 does not place a new address entry into the address table 106.

If learning is enabled, the IRC 68 checks whether autovalidation is also enabled in the rules checker configuration register at step 312. If autovalidation is not enabled, the IRC 68 at step 314 places a new entry into the address table 106 with the receive port number, the VLAN index from the VLAN index-to-ID table (if the received VLAN ID was known) or the receive port-based VLAN index (if the received VLAN ID was not known). The receive port bit is set in the port vector and the valid bit is cleared.

The IRC 68 also sends the frame, receive port number, bin number, entry number and a control opcode, indicating that the SA was learned, to the management port, at step 314. The IRC 68 can use the new address entry in future searches for an SA/Rx port number to find a VLAN index, but it cannot be used in a search of a DA/VLAN index to find a forwarding port vector. The management agent must validate the address entry before the entry can be used in the DA/VLAN Index search.

If the IRC 68 determines that autovalidation is enabled, the IRC 68 places a new entry into the address table at step 316, as described above in step 314. However, the IRC 68 sets the valid bit in the new entry. As a result, the address can be used in a search for an SA/Rx Port number to find a VLAN index and it can be also be used in a search for a DA/VLAN index to find a forwarding port vector. The IRC 68 also sends the frame, receive port number, bin number, entry number and a control opcode, indicating that the SA was learned, to the management port at step 316.

Next the IRC controller 104 performs the DA/VLAN index search to identify a port vector, at step 318. The VLAN index used is the VLAN index found at step 302 (if the VLAN ID is known) or the receive port-based VLAN index (if the received VLAN ID is not known). If the IRC controller 104 finds a DA/VLAN index match, the forwarding port vector is identified at step 320. If the IRC controller 104 cannot find a DA/VLAN index match in the address table 106, the IRC 68 transmits the frame to all members of the VLAN index at step 322. The VLAN index references the VLAN index-to-flood and broadcast vector table to provide the forwarding port vector.

Similar to the case for untagged frames discussed above, the host 120 may prevent "flooding" broadcast frames to the management port and/or expansion bus port by masking the expansion bus port and the management port in the flood vector.

As described above, the host 120 initializes the address table 106 and the IRC controller 104 may add entries to the table 106 as new addresses are learned. The host 120 may also add entries to the address table 106. In order to facilitate changes to the address table, the host 120 generates and maintains a software mapping of the address table 106.

When the host 120 adds an entry to the address table 106, the host 120 inserts addresses and their associated fields into the table 106 and updates its software mapping of the address table 106. Alternatively, the host 120 may change particular fields within an entry in the address table 106, such as the valid bit field, and update the software mapping of the table 106 upon completion. When the IRC 68 learns a new address, the IRC 68 sends the host 120 the information so that the host 120 can maintain an accurate mapping of the address table 106.

The host 120 accesses the IRC address table 106 through two ports in direct I/O space: an IRC address port and an IRC data port. These ports provide access to five IRC address table entry registers in indirect I/O space through which the host 120 can manipulate any field in any entry in the table 106. These five registers contain all the fields of an address table entry, plus the next pointer field. The five IRC address table entry registers are: address table control register (accesses valid bit, hit bit, VLAN tag disable, SA/DA traffic capture, VLAN index and port number), port vector register (accesses port vector), upper address register (accesses upper 16 bits of address), lower address register (accesses lower 32 bits of address) and next pointer register (accesses next pointer).

Figure 14:
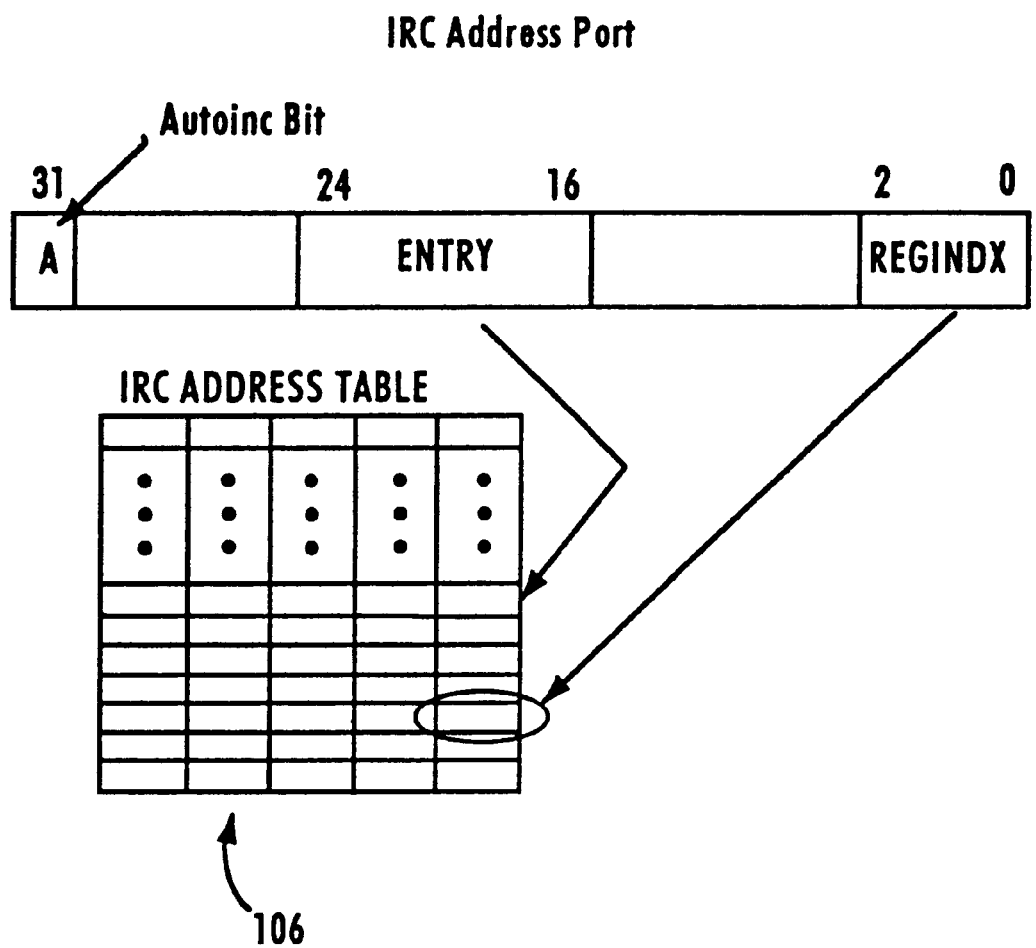
FIG. 14 is a schematic representation of the IRC address port in relation to the IRC address table.

FIG. 14 is a schematic representation of the IRC address port in relation to the IRC address table 106. The host 120 accesses any of the five IRC address table entry registers by writing the desired address table entry number and a desired register index into the IRC address port. The register index identifies which of the five registers will be read/written from/to. The host 120 then reads or writes data into the desired IRC address register(s). An autoincrement bit may be set by the host 120 that enables the host 120 to read/write complete address table entries. When the autoincrement bit is set, each field is written to a temporary register and when the host writes the last register (next pointer register), all of the IRC address table temporary registers are written as a single entry into the address table. Alternatively, if the autoincrement bit is not set, the host may read/write to any given register individually.

Figure 15:
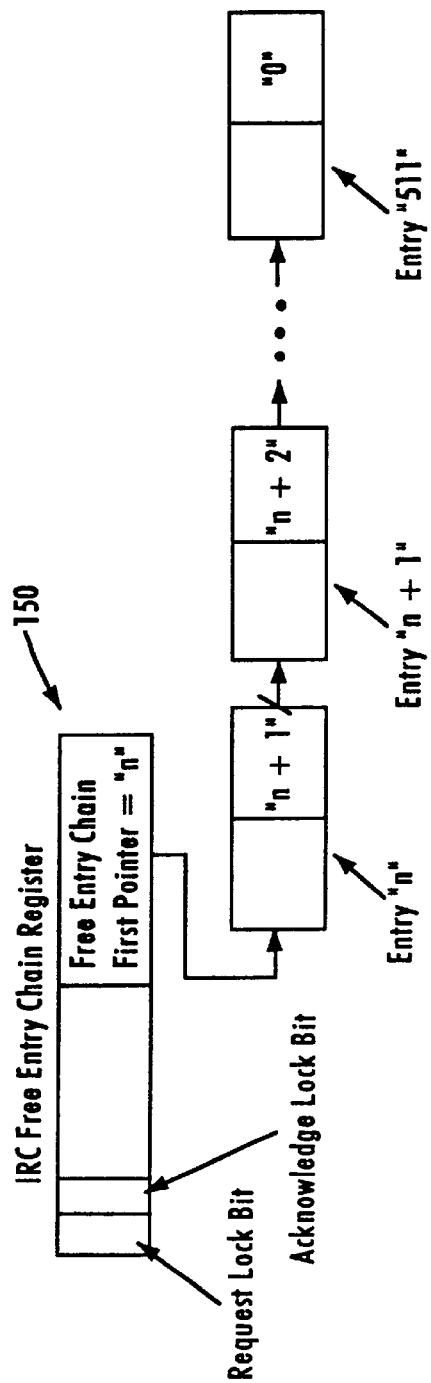
FIG. 15 illustrates the initialization of the IRC free entry chain register and the free entry chain.

After the multiport switch 12 powers up, the host 120 constructs an initial linked list of all "free entries" in the address table 106. This consists of generating a linked list of heap entries "n" through 511 by writing to each entry's next pointer in the address table 106. For example, as shown in FIG. 15, the host 120 writes the next pointer field for heap entry "n" with the value "n+1", the next pointer field for heap entry "n+1" with the value "n+2", etc. The host 120 writes the next pointer for entry 511 with the value "0", indicating that entry 511 is the last entry in the chained list of free entries. The host 120 also stores a first pointer corresponding to the address of the first entry in the free entry chain, which is "n" at power-up, into a free entry chain register 150, as shown in FIG. 15. In the exemplary embodiment, the free entry chain register 150 is located with the PCI control/status registers 74. Alternatively, the free entry chain register 150 may be located in the IRC 68.

When the IRC 68 learns an unknown address, i.e., an address that has an SA/Rx port number not found in the address table 106, as described above, the IRC controller 104 writes the unknown address to the address table 106 in the entry referenced by the free entry chain register's first pointer and updates the free entry chain register's first pointer. For example, with reference to FIG. 15, the IRC controller 104 reads the free entry chain register's first pointer, "n" in this case. The IRC controller 104 then writes the new address information to entry "n" and reads the next pointer of entry "n", which is "n+1". The value "n+1" is then stored in the free entry chain register's first pointer.

In a similar manner, when the host 120 adds a new entry to the address table 106, (possibly due to a new station added to the network), the host 120 reads the free entry chain register first pointer. The host 120 then writes the new information to the address entry referenced by the free entry chain register's first pointer and updates the first pointer, as described above.

Figure 16:
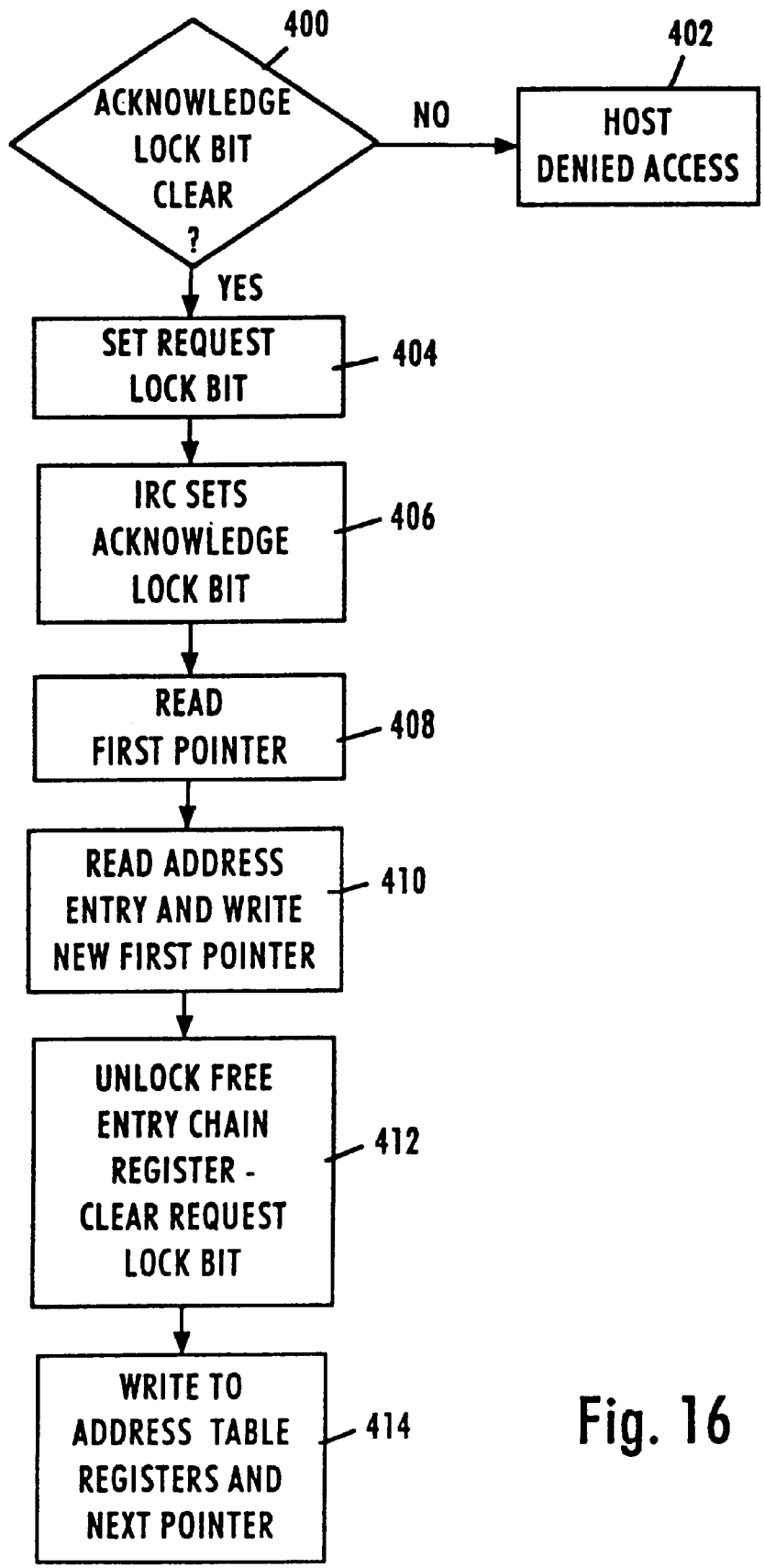
FIG. 16 is a flow diagram illustrating the method of controlling access to the free entry chain register.

Since both the host 120 and IRC 68 access the free entry chain register 150, a problem may exist when both devices try to access the register concurrently. The present invention eliminates this possibility by utilizing a novel locking system. FIG. 16 illustrates the method of using a locking system to control access to the free entry chain register and hence control access to the address table 106, according to an embodiment of the present invention.

When the host 120 wishes to write or read to/from the free entry chain, the host 120 must lock the free entry chain register 150. At step 400, the host 120 first determines whether the free entry chain register acknowledge lock bit is clear. If the acknowledge lock bit is not clear, the IRC 68 may be accessing the free entry chain register and the host 120 is denied access at step 402. If the acknowledge lock bit is clear, the host 120 sets the request lock bit at step 404. The IRC 68 responds and sets the acknowledge lock bit at step 406. Once the acknowledge lock bit is set, the host 120 may add entries to the address table 106. While the free entry chain register 150 is locked, the IRC 68 will not learn unknown source addresses because it will not be able to capture entries from the free entry chain register.

At step 408, the host 120 reads the first pointer in the free entry chain register 150. The host 120 then reads the entry associated with the first pointer and writes the next pointer of this entry to the free entry chain register's first pointer field, at step 410. The host 120 then unlocks the free entry chain register 150 by clearing the request lock bit at step 412. The host 120 writes the new information to the address table registers discussed above and writes the next pointer of the new entry with the value of "0", indicating that the new entry is the last entry in a bin's list, at step 414.

The IRC 68 performs the same process for locking the free entry chain register 150 when a new address is learned. This procedure of locking the free entry chain register when either the host 120 or IRC 68 adds a new entry to the address table 106 ensures that new entries are added in a logical order and that valid entries are not inadvertently overwritten.

As described above, both the host 120 and IRC 68 may add entries to the address table 106. In addition, both the host 120 and IRC 68 may add entries into a particular bin's list. When the host 120 (or IRC 68) adds an entry to the end of a bin's list, the host 120 (or IRC 68) locks the particular bin by accessing a bin lockout register. The bin lockout register 160 is located with the PCI control/status registers 74. In an alternative configuration, the bin lockout register 160 may be located in the IRC 68.

Figure 17:
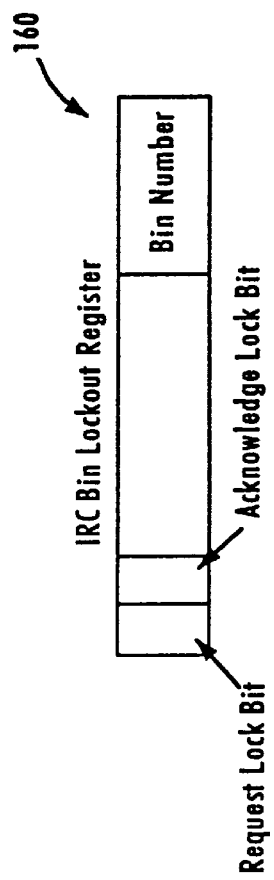
FIG. 17 illustrates the composition of the IRC bin lockout register.

As shown in FIG. 17, the bin lockout register 160 includes a request lock bit, an acknowledge lock bit and a bin number field. While a bin is locked, the host 120 or IRC 68 cannot add an entry to that particular bin. However, the IRC controller 104 can search a locked bin.

Figure 18:
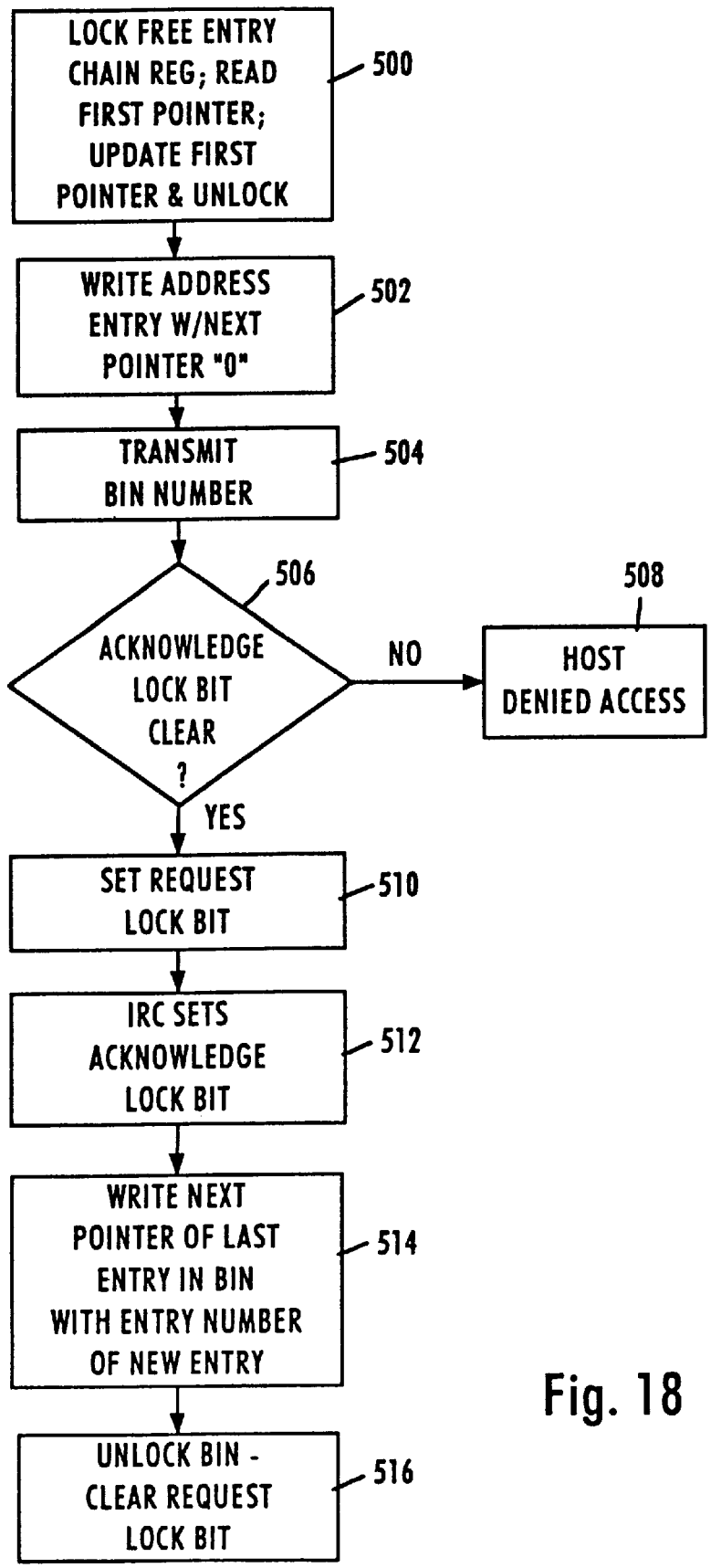
FIG. 18 is a flow diagram illustrating the method of adding an entry in a bin's list.

FIG. 18 illustrates the method of adding an entry to the end of a particular bin's list by the host 120. Alternatively, the IRC 68 may add an entry to a particular bin's list and the procedure is the same. With reference to FIG. 18 at step 500, the host 120 locks the free entry chain register 150, reads the first pointer, updates the first pointer and unlocks the free entry chain register 150 in accordance with the procedure described above and illustrated in FIG. 16. Next at step 502, the host 120 writes the new information to the address table 106 by writing to the address table registers, as described above. The host 120 also writes the next pointer of the new entry with value "0", indicating the new entry will be the last entry in the bin's list.

Once this has been done, the host 120 must lock the IRC bin in order to ensure that the IRC 68 is not accessing the particular bin. At step 504, the host 120 transmits the desired bin number with the request and acknowledge bits clear. Next the host 120 determines whether the acknowledge lock bit for this bin is clear, at step 506. If the acknowledge lock bit is not clear, the IRC 68 may be accessing that particular bin and the host 120 is denied access at step 508. If the acknowledge lock bit is clear, the host 120 sets the request lock bit for this bin, at step 510. The IRC 68 responds and sets the acknowledge lock bit for this bin at step 512. Once the acknowledge lock bit is set, the host 120 can add an entry to the end of the bin's list. At step 514, the host 120 writes the next pointer of the last entry in the specified bin's list with the entry number of the new entry added at step 502. This links the new entry into the specified bin. Finally, the host 120 unlocks the bin at step 516 by clearing the request lock bit.

In the exemplary embodiment, the host 120 is also responsible for performing an aging function. Each time the IRC 68 searches the table for a SA/Rx port number and finds a match, it sets the hit bit in the address entry. To implement aging, the host polls the table's address entries, clears the hit bits, then polls at given intervals of time to tabulate which entries are not active source addresses. This tabulation determines when the host 120 should remove an inactive address. The procedure for removing an aged entry from a bin's list by the host 120 is detailed below. Alternatively, the IRC 68 may remove an aged entry using the same procedure.

The host 120 locks the IRC bin in accordance with the procedure described above and illustrated in FIG. 18. Next, the host 120 writes the next pointer of the entry preceding the last entry in the bin with the value "0". Then the host 120 unlocks the bin. To return the aged entry to the free entry chain, the host 120 locks the free entry chain register 150, in accordance with the procedure described above and illustrated in FIG. 16, and reads the entry number of the first pointer in the free entry chain register. The host 120 writes this entry number into the next pointer of the aged entry (using the address table next pointer register). Then the host 120 writes the entry number of the aged entry to the first pointer field in the free entry chain register 150. Finally, the host 120 unlocks the free entry chain register 150.

For example, with reference to FIG. 10, assume entry "c" (114c) in bin "0" is an aged entry and the host 120 wishes to return the entry to the free entry chain. First the host 120 locks bin 0 and writes the next pointer field in entry "b" (114b) with the value "0". Next, the host 120 unlocks bin 0. The host 120 then locks the free entry chain register 150 and reads the free entry chain register's first pointer. The host 120 next writes this first pointer to the next pointer field of entry "c" (114c) and writes next pointer "c" to the free entry chain register's first pointer field. This process links entry "c" (114c) to the free entry chain which may then be utilized to learn a new address.

The host 120 may also age an entry from the middle of a bin's list. However, the host 120 does not need to lock the IRC bin when aging such an entry. This saves processing time associated with locking the bin. The host 120 writes the next pointer of the address entry preceding the aged entry with the entry number of the address entry following the aged entry. For example, if entry "b" (114b) in FIG. 10 is being returned to the free entry chain, the host 120 writes the next pointer for entry "a" (114a) with a value associated with entry "c". Then the host 120 returns the aged entry "b" (114b) to the free entry chain as described in the previous example.

Described has been a system and method for receiving data from network stations and making frame forwarding decisions for received data frames. An advantage of the invention is that a single address table is used to generate the frame forwarding information enabling the invention to generate data forwarding decisions in an efficient manner. Another advantage of the invention is that the address table generates frame forwarding information for frames utilizing VLAN tags and frames that do not utilize VLAN tags. In this disclosure, there is shown and described only certain preferred embodiments of the invention, but, as aforementioned, it is to be understood that the invention is capable of use in various other combinations and environments and is capable of changes or modifications within the scope of the inventive concept as expressed herein.

What is claimed is:

1. A multiport switch configured for controlling communication of data frames between stations comprising:
   a table for storing address information including data forwarding information and both source addresses and destination addresses;
   a control device configured to:
   receive a source address and a receive port number indicating a port on the switch at which a data frame is received;
   search the table for a first entry having the source address of the data frame and the receive port number;
   identify a VLAN index for that source address and receive port number; and
   receive a destination address from the data frame and search the table for a second entry having the destination address of the frame and the identified VLAN index, the second entry identifying the data forwarding information for the data frame.

2. The multiport switch of claim 1, wherein the table comprises an address field, a virtual local area network (VLAN) field and a port number field.

3. The multiport switch of claim 1, wherein the VLAN index is identified from the first entry.

4. The multiport switch of claim 1, wherein the control device is further configured to receive VLAN information.

5. The multiport switch of claim 4, wherein the VLAN index is identified from the received VLAN information.

6. The multiport switch of claim 1, wherein the control device is further configured to transmit the data forwarding information, the data forwarding information comprising forwarding port data indicating from which port the data frame will be sent.

7. In a multiport switch that controls communication of data frames between stations, the multiport switch including an address table for storing address information including data forwarding information and both source addresses and destination addresses, a method of generating data forwarding information comprising:
   receiving information from a data frame;
   performing a first search of the address table for a first entry with a first specified address and receive port number, using the information received from the data frame;
   performing a second search of the address table for a second entry with a second specified address and a virtual local area network (VLAN) index; and
   identifying data forwarding information associated with the entry found in the second search.

8. The method of claim 7, further comprising:
   identifying the VLAN index based on the first entry.

9. The method of claim 7, wherein the received information further comprises a VLAN identifier, the method further comprising:
   generating the VLAN index from the VLAN identifier.

10. The method of claim 7, wherein the first address is a source address associated with the received data frame and the second specified address is a destination address associated with the received data frame.

11. The method of claim 7, further comprising:
    transmitting the data forwarding information to a switching device for forwarding the frame to the appropriate ports identified by the data forwarding information.

12. The method of claim 7, wherein the search for the second entry further comprises:
    searching for a second entry with a predetermined flag.

13. A multiport switch configured for controlling communication of data frames between stations, comprising:
    a table configured for storing address information indicating both source addresses and destination addresses of data frames and for storing virtual local area network (VLAN) information; and
    a control device configured to receive information from a data frame including a source address and a destination address of the data frame, the control device further configured to:
    search the table for a first entry with the source address of the received data frame and a receive port number indicating the port on which the data frame was received, and search the table for a second entry with the destination address of the received data frame and a VLAN index, wherein the second entry identifies the data forwarding information.

14. The multiport switch of claim 13, wherein the control device is further configured to transmit the data forwarding information, the data forwarding information indicating from which port the data frame will be sent.

* * * * *